US012326470B2

(12) United States Patent
Ali et al.

(10) Patent No.: US 12,326,470 B2
(45) Date of Patent: Jun. 10, 2025

(54) SYSTEMS AND METHODS FOR DETECTING DEFECTS IN MAGNET WIRE INSULATION

(71) Applicant: Essex Furukawa Magnet Wire USA LLC, Atlanta, GA (US)

(72) Inventors: Mohammed Ibrahim Ali, Fort Wayne, IN (US); Russell Glenn Post, Fort Wayne, IN (US); Matthew E. Leach, Fort Wayne, IN (US); Christian Reece Grover, Ossian, IN (US)

(73) Assignee: Essex Solutions USA LLC, Atlanta, GA (US)

( * ) Notice: Subject to any disclaimer, the term of this patent is extended or adjusted under 35 U.S.C. 154(b) by 137 days.

(21) Appl. No.: 18/137,221

(22) Filed: Apr. 20, 2023

(65) Prior Publication Data

US 2023/0400501 A1 Dec. 14, 2023

Related U.S. Application Data

(60) Provisional application No. 63/350,235, filed on Jun. 8, 2022.

(51) Int. Cl.
*G01R 31/00* (2006.01)
*G01R 31/12* (2020.01)
*G01R 31/59* (2020.01)

(52) U.S. Cl.
CPC ..... *G01R 31/1218* (2013.01); *G01R 31/1272* (2013.01); *G01R 31/59* (2020.01)

(58) Field of Classification Search
CPC . G01R 31/59; G01R 31/1218; G01R 31/1272
See application file for complete search history.

(56) References Cited

U.S. PATENT DOCUMENTS

| | | | | |
|---|---|---|---|---|
| 3,827,296 | A | * 8/1974 | Hidaka | .......... G01N 27/82 340/677 |
| 4,552,599 | A | 11/1985 | Masuda et al. | |
| 5,660,565 | A | 8/1997 | Williams | |
| 5,820,008 | A | 10/1998 | College | |
| 6,226,088 | B1 | 5/2001 | Keane | |
| 6,597,455 | B1 | * 7/2003 | Wlodarski | .......... G01N 21/952 356/237.1 |

(Continued)

OTHER PUBLICATIONS

International Search Report and Written Opinion in PCT/US2023/019343; mailed Jul. 20, 2023. 14 pages.

*Primary Examiner* — Thang X Le
(74) *Attorney, Agent, or Firm* — Rhett White

(57) ABSTRACT

A fault detection system for use with wire includes an outer housing and a detection component positioned within the housing. The detection component includes a plurality of emitters and a plurality of detectors positioned around an examination area through which a wire is traversed. Each adjacent pair of emitters is spaced no more than 30 degrees apart, and each of the plurality of detectors is positioned across the examination area from a corresponding emitter. Each of the emitters is configured to emit a signal that is measured by a corresponding detector, and the detection component is configured to detect one or more defects on a surface of the wire based upon changes in the signals measured by one or more of the plurality of detectors.

23 Claims, 16 Drawing Sheets

(56) References Cited

U.S. PATENT DOCUMENTS

| | | | |
|---|---|---|---|
| 7,460,703 B2 * | 12/2008 | Chang | H04N 7/18 |
| | | | 382/152 |
| 7,755,749 B2 * | 7/2010 | Kobayashi | G01N 21/952 |
| | | | 356/237.1 |
| 2007/0188739 A1 * | 8/2007 | Aoshima | G01N 21/896 |
| | | | 356/73.1 |
| 2013/0229650 A1 | 9/2013 | Fiberqa et al. | |
| 2016/0139062 A1 * | 5/2016 | Faraldi | C03B 37/025 |
| | | | 356/73.1 |
| 2019/0049372 A1 * | 2/2019 | Kohda | G01M 11/00 |

* cited by examiner

SECTION A-A'

SYSTEMS AND METHODS FOR DETECTING DEFECTS IN MAGNET WIRE INSULATION

CROSS-REFERENCE TO RELATED APPLICATION

This application claims priority to U.S. Provisional Application No. 63/350,235, filed Jun. 8, 2022 and entitled "Systems and Methods for Detecting Defects in Magnet Wire Insulation," the contents of which is incorporated by reference herein in its entirety.

TECHNICAL FIELD

Embodiments of the disclosure relate generally to systems, devices, and methods for detecting defects in magnet wire insulation, and more particularly, to systems, devices, and methods for the contactless and inline detection of defects in magnet wire insulation having different cross-sectional shapes.

BACKGROUND

Magnet wire, also referred to as winding wire or magnetic winding wire, is utilized in a wide variety of electric machines and devices, such as inverter drive motors, motor starter generators, transformers, etc. Magnet wire typically includes insulation, such as polymeric enamel insulation, formed around a central conductor. The enamel insulation is formed by applying a varnish onto the wire and curing the varnish in an oven to remove solvents, thereby forming a thin enamel layer. This process is repeated until a desired enamel build or thickness is attained. During the formation of an enamel or other insulation layer, it is possible that undesirable surface flaws or defects are inadvertently formed, such as enamel beads or protrusions. In some cases, defects lower the performance of the magnet wire or lead to premature failure of the wire insulation.

During magnet wire production, it is desirable to inspect the wire insulation for surface flaws or defects. Several conventional wire inspection systems have been developed. Certain systems utilize spring loaded rollers and identify defects based upon movement of the rollers; however, these systems are required to make contact with the wire and may result in insulation damage. It may also be very difficult to detect relatively small defects with a roller system. Other conventional systems direct laser light onto a wire and utilize complementary oxide semiconductor ("CMOS") or similar sensors to detect light reflected off the wire. Defects are identified based on detecting changes in the reflected light. However, systems that utilize lasers and CMOS sensors can be very expensive. Other optical detection systems direct light onto a wire and detect defects based upon how the light is scattered off the wire or how an amount of detected light changes.

Known conventional detection systems (e.g., conventional laser detection systems, optical detection systems, and roller systems) cannot detect defects on all portions of an outer surface of a magnet wire. For example, conventional systems can only detect defects on the flat sides of a rectangular magnet wire. Conventional systems typically include only two axes of detection capable of examining the flat surfaces of rectangular wire. However, rectangular or shaped magnet wire often includes flat sides and rounded or shaped corners. Due to the flow of varnish when applied to wire, defects can occur on the rounded corners of rectangular wire. The conventional detection systems are unable to inspect and detect defects on the curved radii of the wire corners, which may result in the production and sale of undesirable magnet wire. Accordingly, there is an opportunity for improved systems, devices, and methods for detecting defects in magnet wire insulation. There is further an opportunity for improved systems, devices, and methods that facilitate contactless and inline detection of relatively small defects in magnet wire having different cross-sectional shapes.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items; however, various embodiments may utilize elements and/or components other than those illustrated in the figures. Additionally, the drawings are provided to illustrate example embodiments described herein and are not intended to limit the scope of the disclosure.

DETAILED DESCRIPTION

Figure 1A:
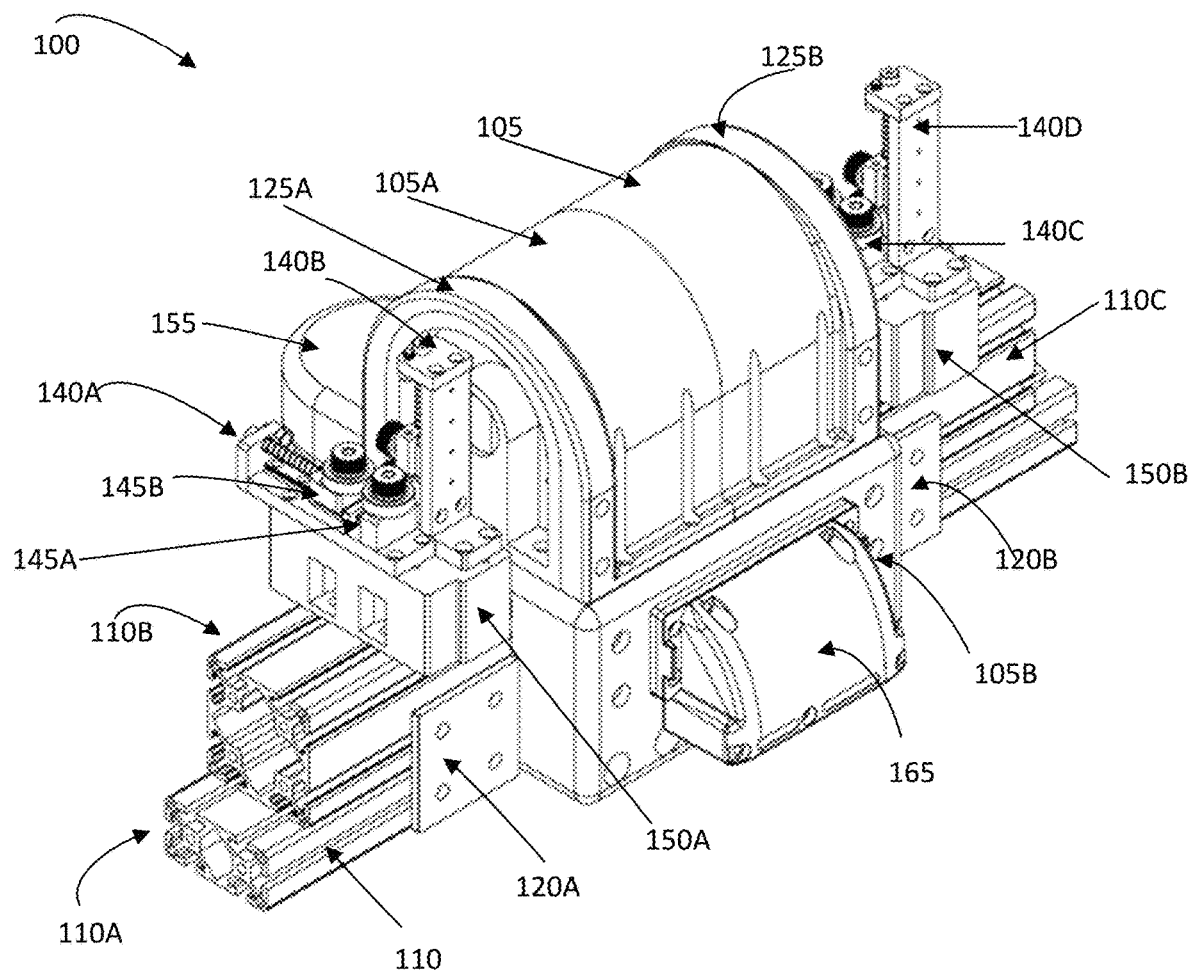
FIG. 1A illustrates a perspective view of an example system for detecting defects in magnet wire insulation, according to an illustrative embodiment of the disclosure.

Certain embodiments of the present disclosure are directed to systems and devices for inline contactless detection of defects or faults in magnet wire. A fault detection system may include a detection component positioned within a housing. The detection component may include a plurality of emitters (e.g., light emitting diodes, etc.) configured to project respective light signals onto and past a magnet wire and a plurality of detectors (e.g., photodiodes, etc.) that are each respectively configured to detect a light signal of a corresponding emitter. The detection component may identify defects in the magnet wire insulation based upon detecting changes in the amplitude of the light received by one or more of the detectors. Any number of suitable emitter and detector pairs may be incorporated into the detection component as desired, such as twelve pairs which permit examination of a magnet wire along twelve axes.

According to an aspect of the disclosure, the emitters may be spaced along or positioned at different points along a ring, and a magnet wire to be examined may be passed approximately through a center of the ring. Additionally, each adjacent set of emitters may be spaced from one another along the ring such that the detection system can identify defects on any portion of an outer surface of a magnet wire. For example, emitters may be spaced approximately 15 degrees apart along a circumference or periphery of a ring. In certain embodiments, the emitters may be spaced such that defects can be identified on any portion of an outer surface of a rectangular magnet wire having rounded or curved corners. For typical sizes and constructions of shaped rectangular wire, it has been found that emitters should be spaced no more than 17 degrees apart in order to adequately detect defects on any portion of an outer surface of the wire (i.e., flat surfaces and rounded corners) having amplitudes as small as 20 microns (e.g., defects smaller than 22 microns, defects smaller than 25 microns, etc.).

As desired, the detection system may include a wide variety of other suitable components. In certain embodiments, the detection system may include one or more wire guides (e.g., guide rollers, etc.) configured to position a magnet wire for examination within the detection component. In certain embodiments, one or more suitable mounting rails may facilitate positioning of the detection system within a magnet wire production line such that fault detection can be performed in an inline manner. In certain embodiments, the detection system may include one or more suitable air ducts or ventilation components that facilitate the removal of unwanted debris within the detection system and/or the cooling of internal components.

Other embodiments of the disclosure are directed to methods for inline contactless detection of faults in magnet wire. A plurality of emitters (e.g., light emitting diodes, etc.) and corresponding detectors may be provided and positioned along an outer circumference of a ring. In certain embodiments, the emitters may be spaced no more than 30 degrees apart, such as no more than 17 degrees apart or approximately 15 degrees apart. Each detector may be spaced across the ring from a corresponding emitter. A magnet wire may be passed approximately through a center of the ring. While the magnet wire is passed through the ring, the emitters may each continuously project a respective light signal onto and past the wire, and the corresponding detectors may each detect a light signal of a corresponding emitter. Based upon changes in the amplitude of light received by one or more of the detectors, faults or defects in the insulation of the magnet wire may be identified. As desired, defects may be counted over a desired longitudinal length of the wire and any number of suitable alarms or alerts may be generated.

Embodiments of the disclosure now will be described more fully hereinafter with reference to the accompanying drawings, in which certain embodiments of the disclosure are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1B:
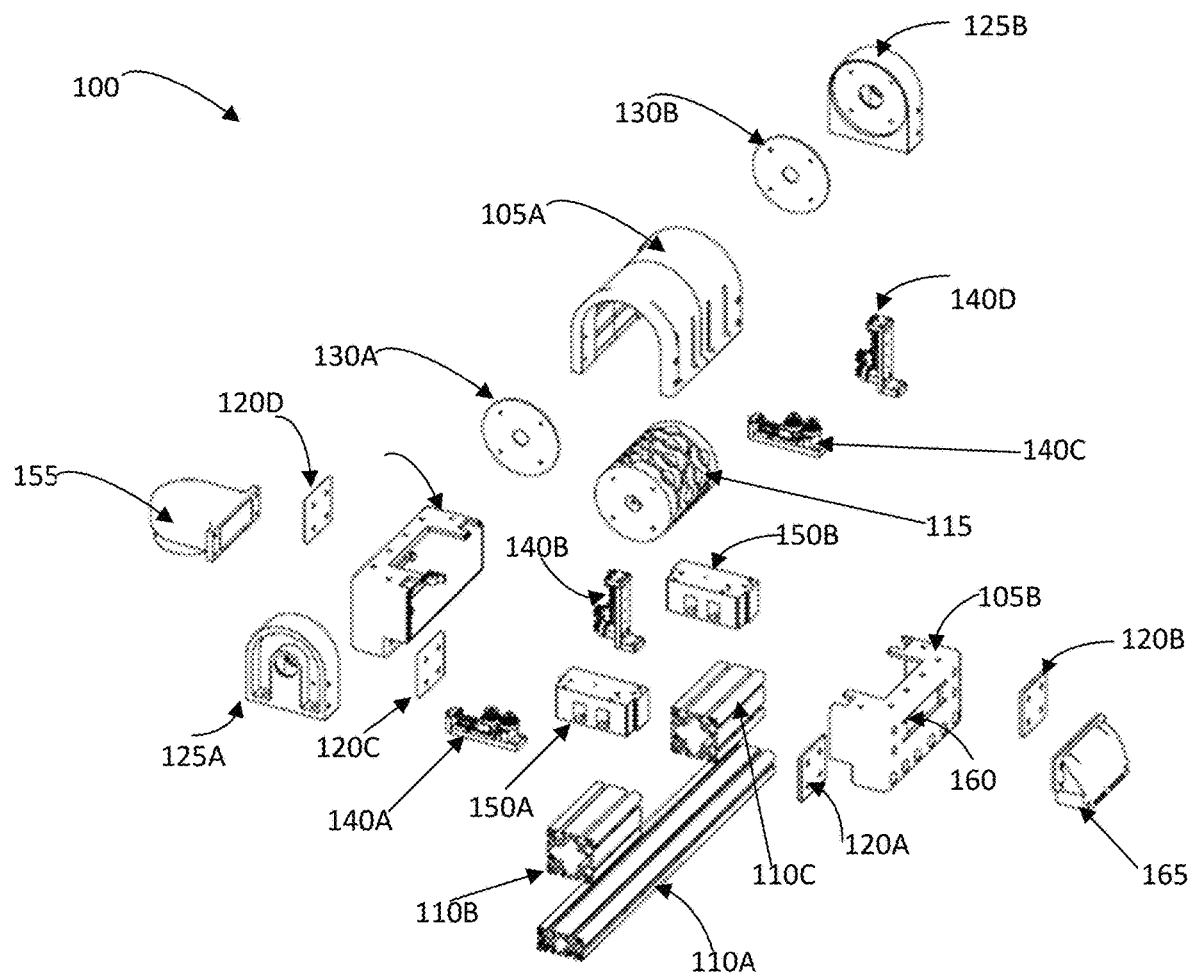
FIG. 1B illustrates an exploded perspective view of the example system of FIG. 1A.
Figure 1C:
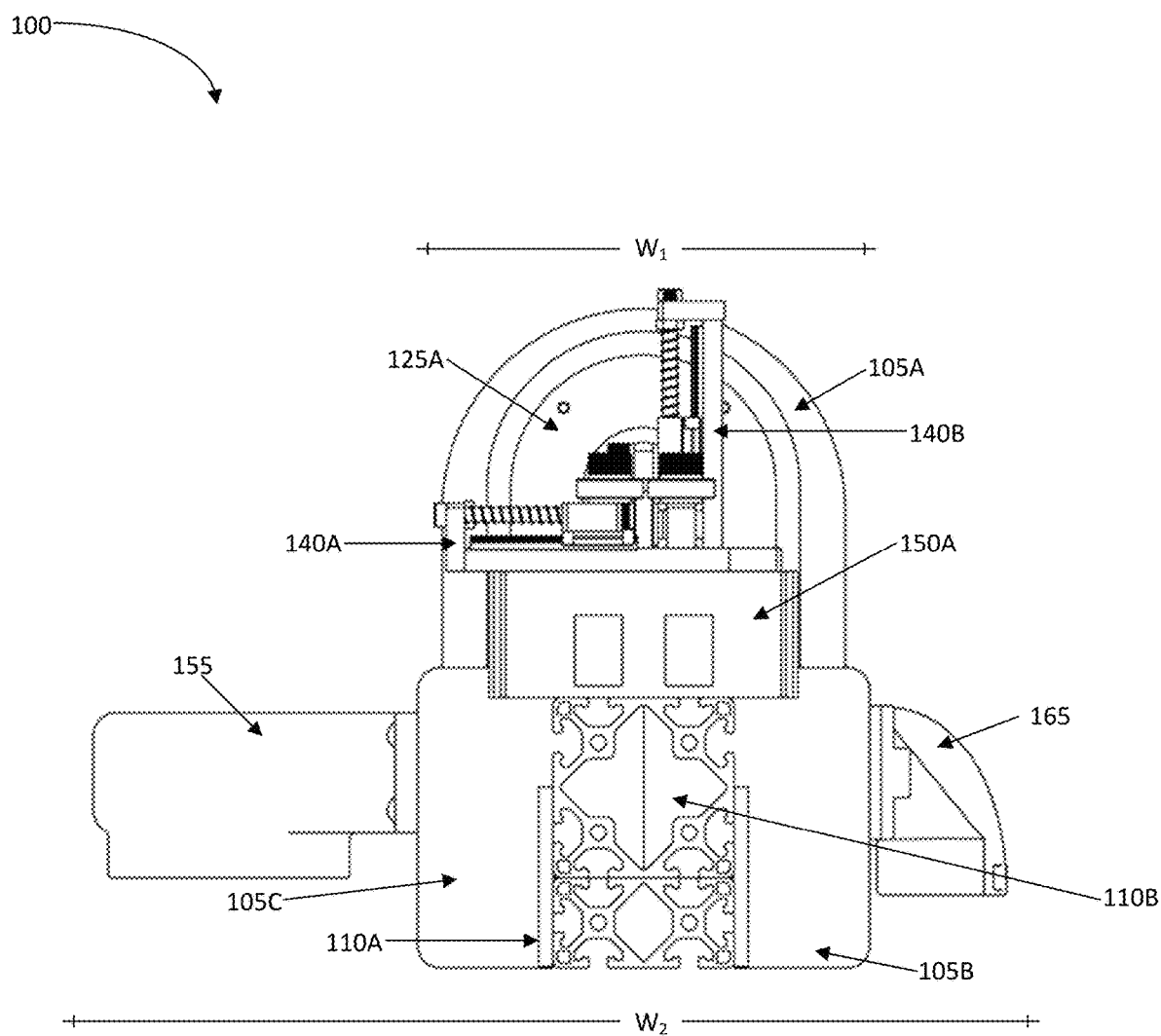
FIG. 1C illustrates an end view of the example system of FIG. 1A.
Figure 1D:
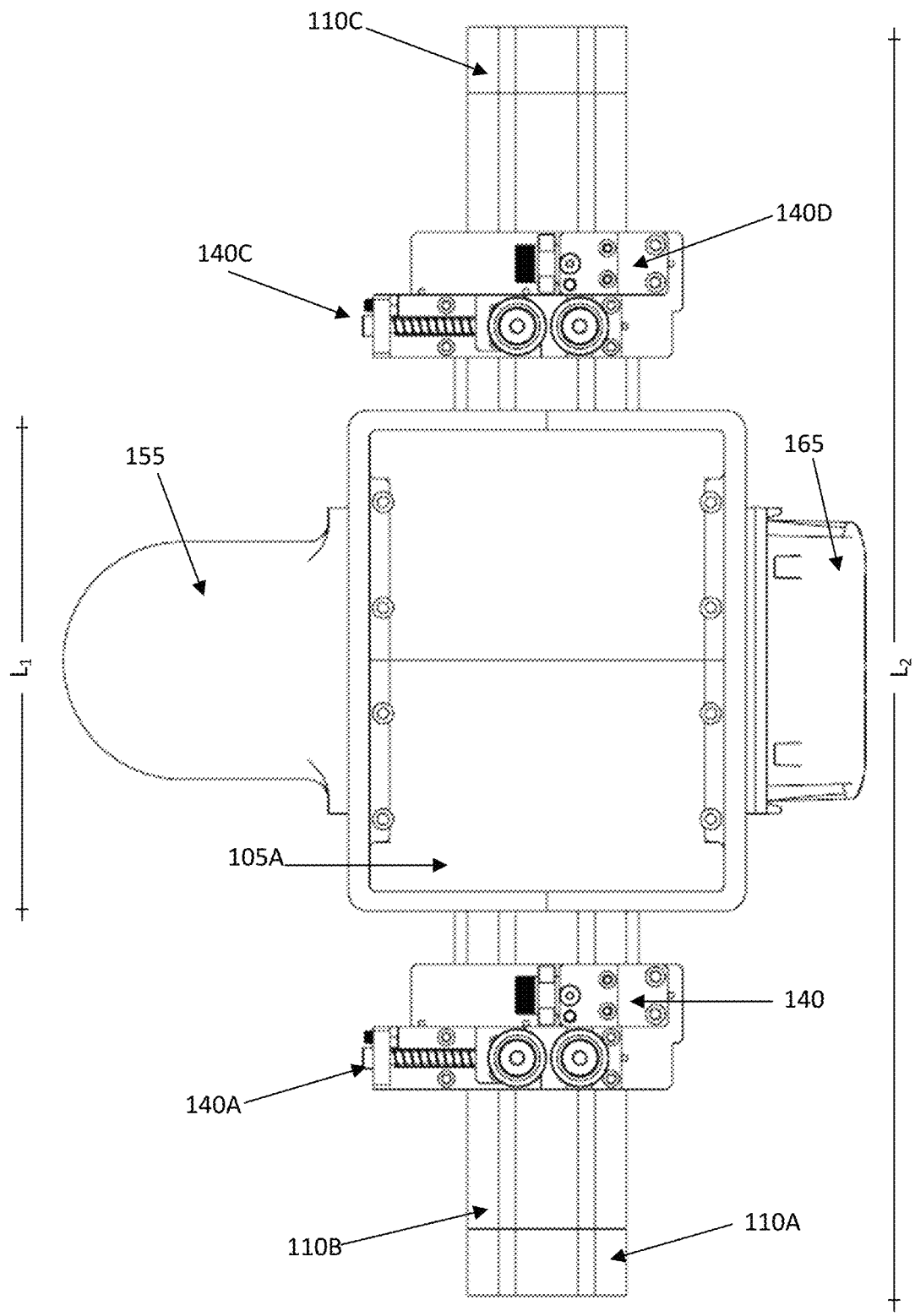
FIG. 1D illustrates a top view of the example system of FIG. 1A.
Figure 1E:
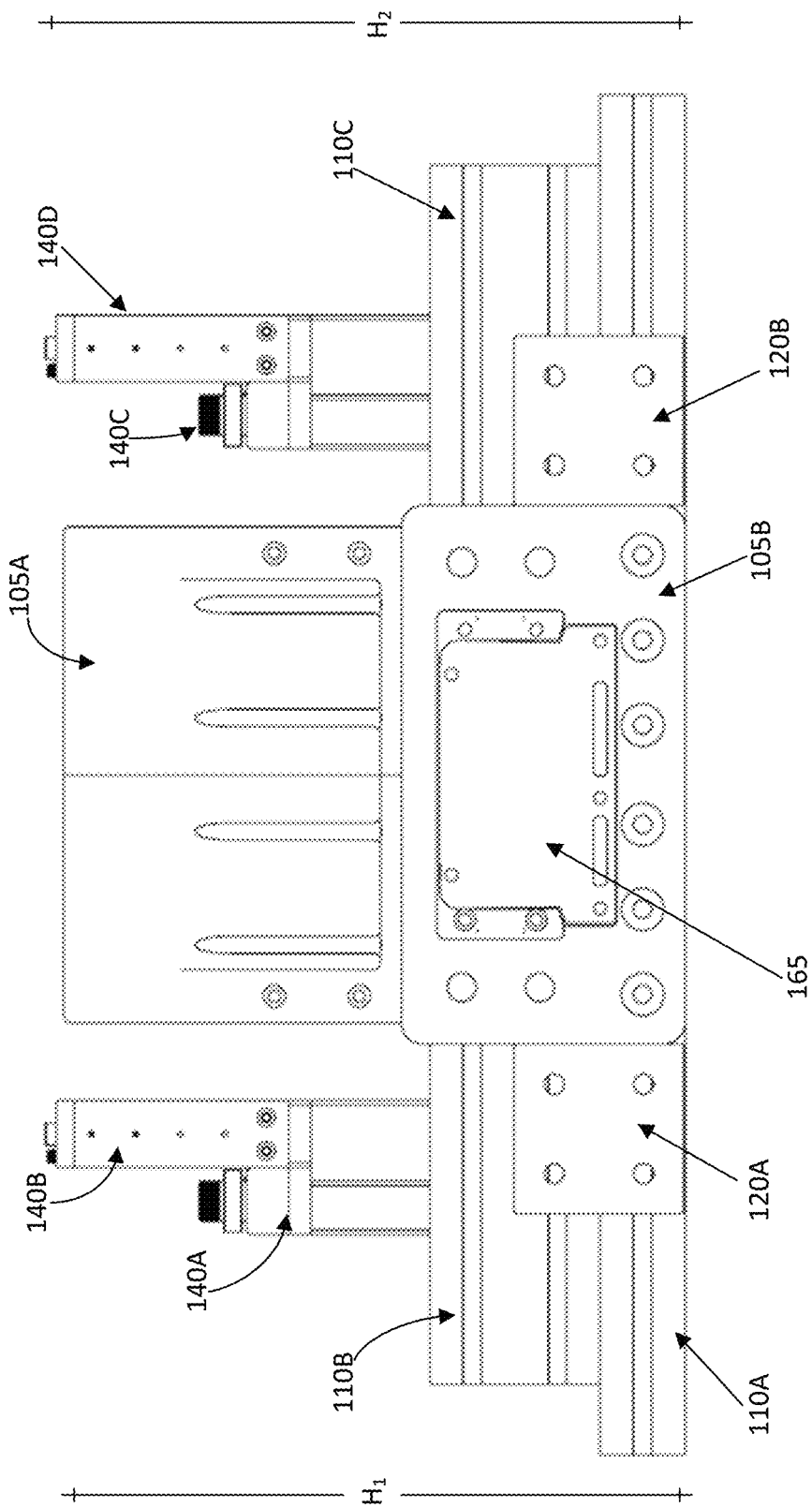
FIG. 1E illustrates a side view of the example system of FIG. 1A.
Figure 1F:
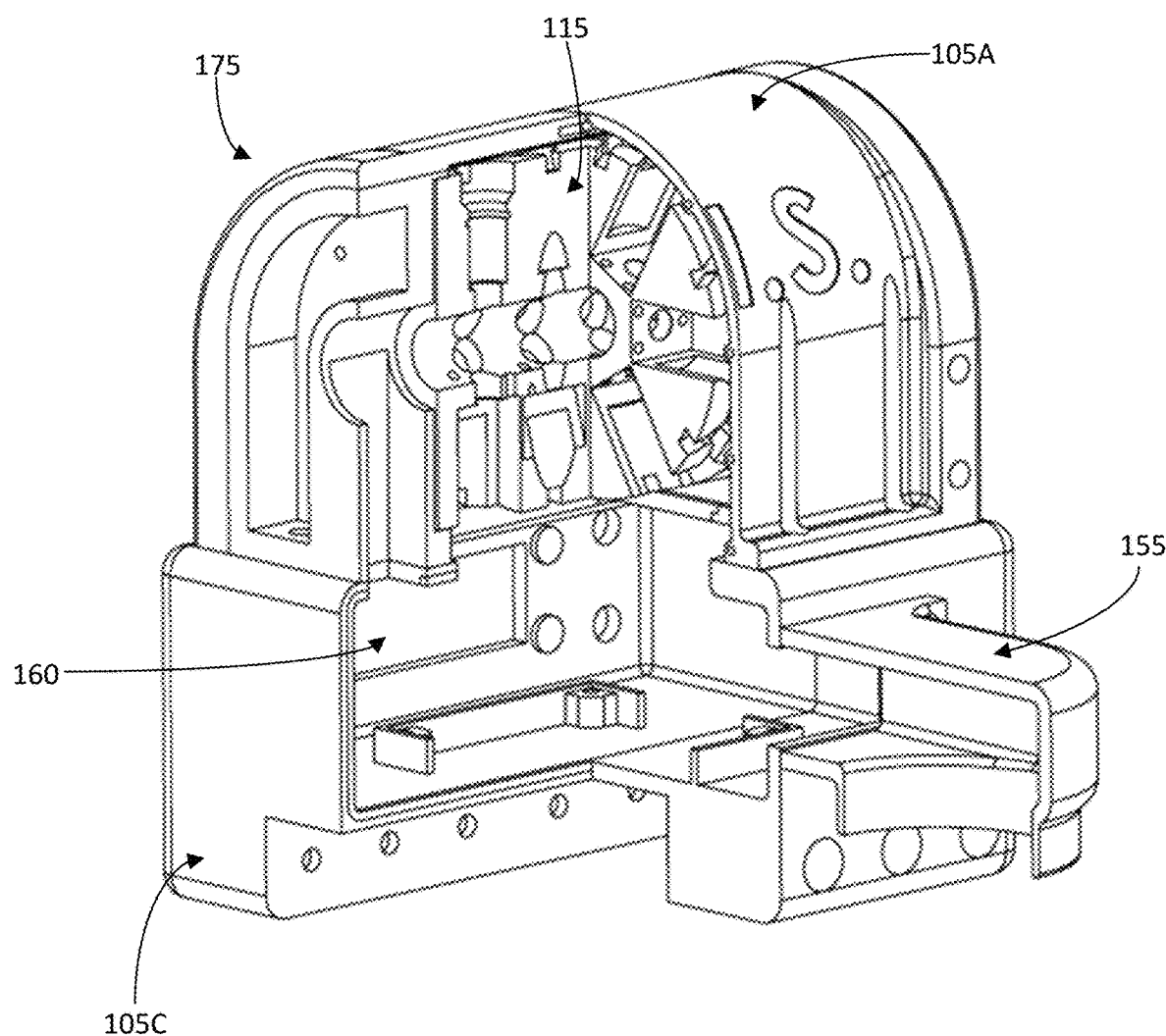
FIG. 1F illustrates a cut-away perspective view of a portion of the example system of FIG. 1A.
Figure 1G:
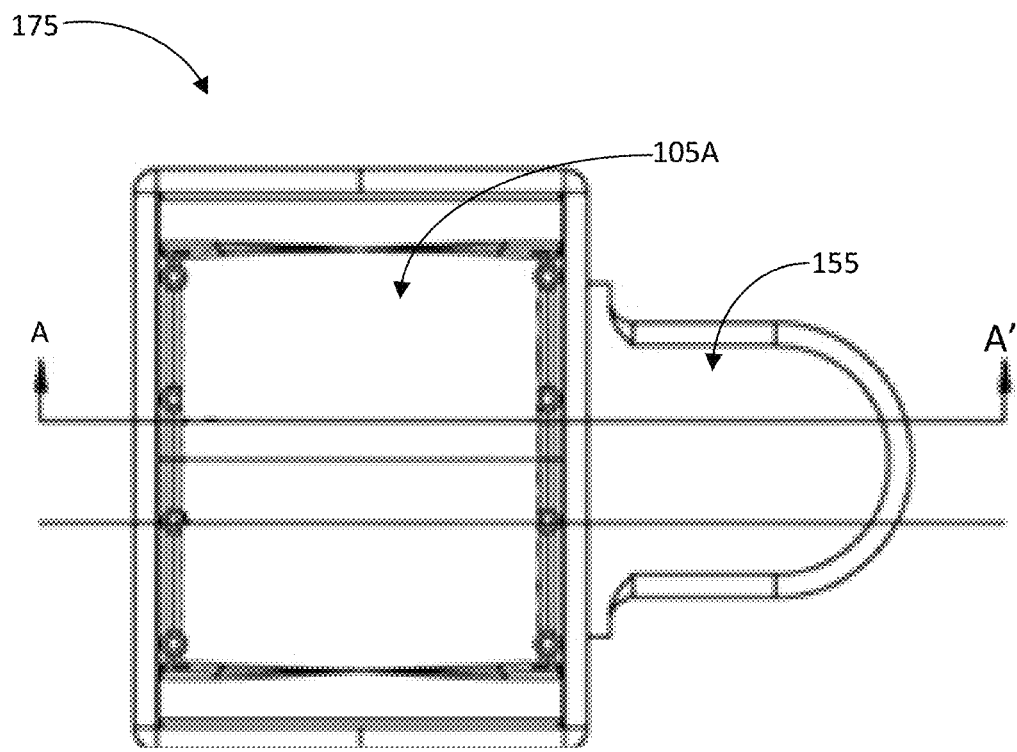
FIG. 1G illustrates a top view of a portion of the example system of FIG. 1A.
Figure 1H:
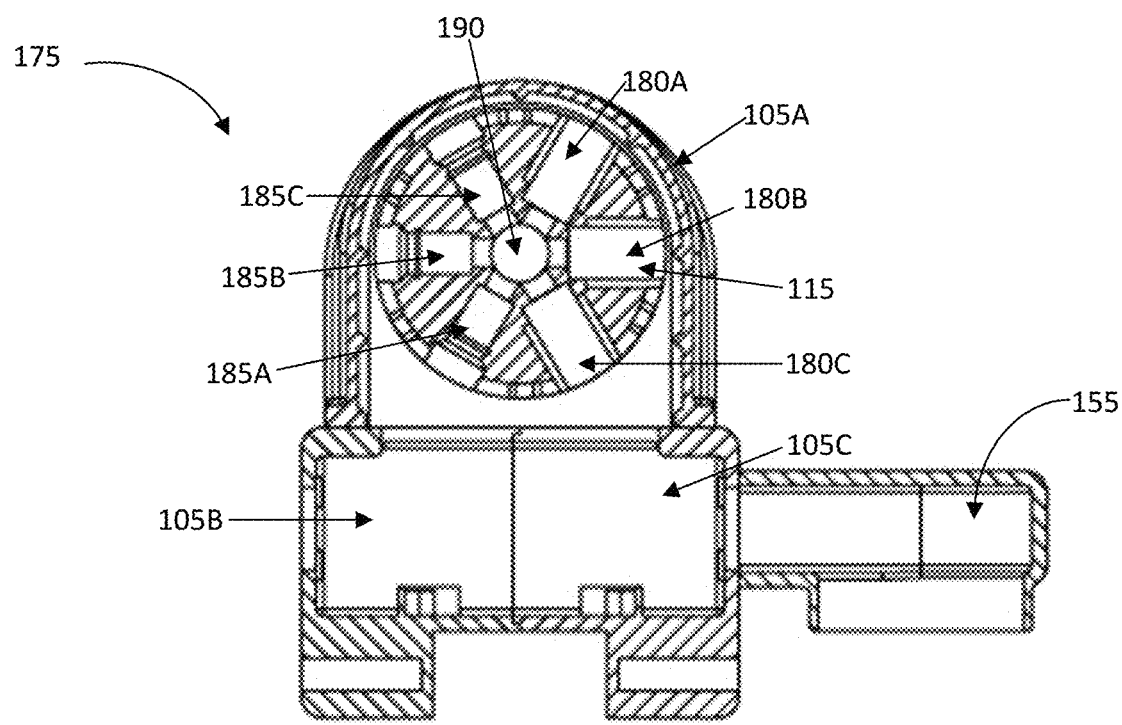
FIG. 1H illustrates a cross-sectional view of a portion of the example system of FIG. 1A.

FIGS. 1A-1H depict different views of an example fault detection system 100 that may be utilized to examine and detect faults in magnet wire insulation in an inline and contactless manner. In particular, FIG. 1A illustrates a perspective view of the system 100; FIG. 1B illustrates an exploded perspective view of the components of the system 100; FIG. 1C illustrates an end view of the system; FIG. 1D illustrates a top view of the system 100; FIG. 1E illustrates a side view of the system 100; FIG. 1F illustrates a cut-away view of a portion 175 of the system 100 (a portion of the system 100 defined by the housing 105 that does not include mounting rails and wire guides); FIG. 1G illustrates a top view of the portion 175 of the system 100; and FIG. 1H illustrates a cross-sectional view of the portion 175 of the system 100 taken along line A-A'. The example system 100 is described in greater detail below with reference to FIGS. 1A-1H.

The fault detection system 100 may include at least a housing 105, a mounting rail 110, and a detection component 115. As shown in FIGS. 1F and 1H, the detection component 115 may be positioned within the housing 105. The housing 105 may provide a wide variety of benefits including, but not limited to, protecting one or more internal components of the system 100 from physical damage, preventing or limiting dust or debris from damaging one or more internal components, and/or shielding one or more internal components from electrical noise or interference. In certain embodiments, the housing 105 may be formed from a single or unitary component and, as desired, may include one or more access panels or other features that allow internal components of the system 100 to be accessed. In other embodiments, the housing 105 may include a plurality of components that may be selectively attached or connected to one another (e.g., to facilitate access of internal components to set up or perform maintenance on the system 100). As desired, the housing 105 may include any suitable number of components. For example, as depicted in FIGS. 1A-1H, the housing 105 may include a top 105A and two sides 105B, 105C. Components 105A-C may be connected together via any suitable attachment means, such as bolts, clips, etc. In other embodiments, the housing 105 may include more or less than three components.

The housing 105 may be formed from a wide variety of suitable materials and/or combinations of material. For example, the housing 105 may be formed from metallic materials (e.g., steel, etc.), metallic alloys, plastics (e.g., ABS plastic, polycarbonate, etc.), etc. As desired, the components 105A-C may all be formed from the same material(s) or, alternatively, at least two components 105A-C may be formed from different materials. Additionally, the housing 105 may be formed with a wide variety of suitable dimensions (e.g., length, width, height, cross-sectional area, etc.). In certain embodiments, the dimensions of the housing 105 may be based at least in part on the size(s) of magnet wires intended to be evaluated by the system 100. For many conventional sizes of magnet wire, the system 100 may be designed with relatively small dimensions, thereby permitting the system 100 to be easily installed in relatively small spaces within a magnet wire production line. For example, the system 100 may occupy a volume of approximately one cubic foot (0.028 cubic meters) or less. Accordingly, the housing 105 may be appropriately sized to fit within the small footprint of the overall system 100. In one example embodiment, the housing 105 may have a width "$W_1$" of approximately 7.5 inches (190.5 mm), a longitudinal length "$L_1$" of approximately 9.5 inches (241.3 mm), and a height "$H_1$" of approximately 10.969 inches (278.61 mm). Additionally, the system 100 may have a width "$W_2$" of approximately 13 inches (330.2 mm), a longitudinal length "$L_2$" of approximately 24.0 inches (609.6 mm), and a height "$H_2$" of approximately 11.29 inches (286.77 mm). In other embodiments, different dimensions may be utilized to accommodate other wire sizes or to accommodate the evaluation of insulated components other than magnet wire.

The mounting rail 110 may facilitate mounting or positioning of the system 100 within a manufacturing environment, such as within a magnet wire production line. Other components of the system 100, such as the housing 105 and any suitable number of wire guides 140A-D may be attached to the mounting rail 110 via any suitable attachment means, such as bolts, clips, brackets, etc. The mounting rail 110 may include any suitable number of components as desired. As shown in FIGS. 1A-1E, the mounting rail 110 may include a base or bottom rail 110A and two top rails sections 110B, 110C that may be attached to the bottom rail 110A. Other numbers of components may be utilized in other embodiments. In yet other embodiments, the system 100 may include other types of mounting brackets (e.g., brackets affixed to the housing, etc.) or other suitable components as an alternative to a mounting rail 110.

In certain embodiments, the housing 105 may be affixed or attached to the bottom rail 110A. Additionally, the bottom rail 110A may facilitate mounting of the system 100 within a wire line. The system 100 may be oriented in any suitable direction within a wire line, such as a horizontal or a vertical orientation. The top rail sections 110B, 110C may be attached to the bottom rail 110A via any suitable attachment components (e.g., bolts, pins, clips, etc.), such as the illustrated mounting plates 120A-D. As shown, a first top rail section 110B may be positioned adjacent to a first end of the housing 105 and a second top rail section 110C may be positioned adjacent to a second or opposite end of the housing 105. The top rail sections 110B, 110C may facilitate the selective positioning of wire guides 140A-D on opposite ends of the housing 105. Additionally, the top rail sections 110B, 110C (and any components mounted on the top rail sections) may be selectively removed from the bottom rail 110A or selectively moved along the bottom rail 110A to facilitate access to other components of the system 100 (e.g., the detection component 115) and/or to facilitate threading or positioning a magnet wire within the system 100. As shown, the mounting plates 120A-D (or other suitable attachment components) may be removed in order to remove the top rail sections 110B, 110C or to reposition (e.g., slide, etc.) the top rail sections 110B, 110C along a length of the bottom rail 110A.

The mounting rails 110 and/or the mounting brackets 120A-D may be formed from a wide variety of suitable materials and/or combinations of materials. For example, the mounting rails 110 and/or the mounting brackets 120A-D may be formed from metallic materials (e.g., steel, etc.), metallic alloys, plastics (e.g., ABS plastic, polycarbonate, etc.), etc. Additionally, the mounting rails 110 and/or the mounting brackets 120A-D may be formed with a wide variety of suitable dimensions (e.g., length, width, height, cross-sectional area, etc.).

With continued reference to the system 100, a wide variety of suitable components may be utilized to mount the detection component 115 within the housing 105. For example, end caps 125A, 125B may be positioned on opposite ends of the detection component 115. The end caps 125A, 125B may be a part of the housing 105 or may be affixed to the housing 105, and the detection component 115 may be directly or indirectly affixed to the end caps 125A, 125B. In certain embodiments, one or more suitable spacers 130A, 130B may be positioned between the end caps 125A, 125B and the detection component 115. As shown, a single spacer is positioned on opposite ends of the detection component 115; however, other numbers of spacers (or no spacers) may be utilized. The end caps 125A, 125B and spacers 130A, 130B may be formed with any suitable dimensions and/or from any suitable materials, such as metallic materials, metallic alloys, plastics, etc.

The system 100 may optionally include any suitable number of wire guides that facilitate maintaining a wire at a desired position within the detection component 115 for examination. As shown, the system 100 may include a plurality of wire guide rollers, such as horizontal guide rollers 140A, 140C respectively positioned on opposite ends of the housing 105 and vertical guide rollers 140B, 140D respectively positioned on opposite ends of the housing 105. Other suitable types of wire guides (e.g., dies, funnels, etc.) may be utilized in other embodiments and will appreciated by those skilled in the art. As shown, the guide rollers 140A-D may be mounted or affixed to the top rail sections 110B, 110C, thereby allowing the guide rollers 140A-D to be selectively removed or repositioned. In other embodiments, the guide rollers 140A-D (and/or other wire guides) may be positioned within the housing 105.

The guide rollers 140A-D may facilitate guiding and maintaining a position of a wire as it travels through the detection component 115. For example, a first horizontal roller 140A may assist in maintaining a horizontal position of a wire and a first vertical roller 140B may assist in maintaining a vertical position of the wire as the wire enters the detection component 115. Similarly, a second horizontal roller 140C may assist in maintaining a horizontal position of the wire and a second vertical roller 140D may assist in maintaining a vertical position of the wire as the wire exits the detection component 115. As a result, the wire may be passed through a desired area of the detection component 115 to facilitate examination of the wire insulation for defects. It will be appreciated that the functions of the horizontal and vertical guide rollers may be reversed or otherwise altered depending on the orientation of the system 100 (e.g., vertical orientation, horizontal orientation, etc.)

within a wire line. Reference to horizontal and vertical guide rollers is made simply to facilitate ease of understanding herein.

With reference to one of the guide rollers (e.g., the first horizontal roller 140A), a guide roller (generally referred to as roller 140) may include a pair of rollers 145A, 145B, and a wire may be positioned between the two rollers 145A, 145B. In certain embodiments, a first roller 145A may have a fixed position, and a second roller 145B may be spring mounted. As a result, different sizes of wire may be positioned within the guide roller 140. In other embodiments, other suitable means may be utilized to adjust and affix the positions of the rollers 145A, 145B in order to accommodate different wire sizes. Further, the rollers 145A, 145B may be formed from a wide variety of suitable materials, such as metallic materials (e.g., hardened steel, etc.), metallic alloys, plastics, etc.

In certain embodiments, the guide rollers 140A-D may be directly mounted on or affixed to the top rail sections 110B, 110C. In other embodiments, the guide rollers 140A-D may be affixed to mounting blocks 150A, 150B that are attached to the top rail sections 110B, 110C. For example, the first vertical and horizontal guide rollers 140A, 140B may be attached to a first mounting block 150A, and the first mounting block 150A may be attached to the first top rail section 110B. Similarly, the second vertical and horizontal guide rollers 140C, 140D may be attached to a second mounting block 150B, and the second mounting block 150B may be attached to the second top rail section 110C. The mounting blocks 150A, 150B may function as spacers that assist in the proper positioning of the guide rollers 140A-D at an entrance and exit of the detection component 115.

The detection component 115 may evaluate a wire that is passed through it in a contactless and inline manner (e.g., as insulation layer(s) are formed on the wire) and detect or identify defects or faults on the surface of the wire or on the surface of wire insulation. For example, the detection component 115 may identify beads that protrude from the surface of enamel or other wire insulation. According to an aspect of the disclosure, the detection component 115 may include a plurality of emitters (e.g., light emitting diodes, laser LEDs, etc.) configured to project respective light signals onto and past a magnet wire and a plurality of detectors (e.g., photodiodes, etc.) that are each respectively configured to detect a light signal output by a corresponding emitter. A few example emitters 180A-C and detectors 185A-C are illustrated in the cross-sectional view of FIG. 1H. The detection component 115 may identify defects in the magnet wire insulation based upon detecting changes in the amplitude of the light received by one or more of the detectors. The use of light emitting diodes ("LEDs") and photodiodes in a detection component 115 may result in the system 100 having a lower cost than conventional detection systems (e.g., detection systems that use lasers and CMOS sensors, etc.) and/or in the system 110 having relatively low voltage requirements and/or power consumption (e.g., consumption of approximately 5 Watts or less). For example, the system 100 may operate at low voltages (e.g., 15 VDC, 12 VDC, etc.). In other embodiments, the detection component 115 may include other types of emitters and detectors, such as lasers and CMOS sensors, etc.

Each emitter (generally referred to as emitter 180) may be configured to emit or project a wide variety of suitable light signals. For example, each emitter 180 may include a light emitting diode ("LED") configured to emit light at approximately 700 nm. Other suitable wavelengths of light may be utilized as desired. Additionally, as explained in greater detail below with reference to FIG. 3, the light from an emitter 180 may be focused into a desired area via any suitable number of filtering devices and/or lenses. Each detector (generally referred to as detector 185) may be configured to detect the light from a corresponding emitter 180. For example, each detector 185 may include a photodiode focused on a wavelength of light (e.g., 700 nm, etc.) associated with the emitter 180. As explained in greater detail below with reference to FIGS. 3 and 4, any suitable number of filtering devices (e.g., a slit plate, etc.) may be utilized to focus the signal received by a detector 185.

Any number of suitable emitter and detector pairs may be incorporated into the detection component 115, such as twelve pairs which permit examination of a magnet wire along twelve axes. In various embodiments, the detection component 115 may include 6, 8, 9, 10, 12, 14, 15, or a greater number of pairs of emitters and detectors. Additionally, the detection component 115 may be configured to examine a magnet wire via any suitable number of axes. According to an aspect of the disclosure, the emitter and detector pairs may be spaced around an outer periphery of an examination area 190 within the detection component 115, and a magnet wire may be passed through the examination area 190. For example, the emitters may be spaced along or positioned at different points along a ring or circle, and the magnet wire to be examined may be passed approximately through a center of the ring. In certain embodiments, the emitter and detector pairs positioned within a ring or along a circumference of the ring may be referred to as an optic ring. In other embodiments, the emitter and detector pairs may be positioned along an outer periphery of a shape other than a circle (e.g., an oval, etc.), and the data signals measured by various detectors may be processed accordingly in order to detect faults.

In certain embodiments, the emitters may be positioned completely around an optic ring. In other embodiments, as illustrated in FIG. 2D, the emitters may be spaced approximately 180 degrees around an optic ring. Detectors may then be spaced approximately 180 degrees around the other half of the optic ring such that each detector is positioned across the optic ring from a corresponding emitter. In certain embodiments, each emitter may direct a light beam onto and past a magnet wire such that the light passes on either side of the wire. As a result, a single light beam may facilitate examination of two opposing portions of the outer surface of the wire (e.g., a top and bottom surface, a left and right surface, opposing corners, etc.).

Additionally, each adjacent set of emitters may be spaced from one another along the ring such that the detection system 115 can identify defects on any portion of a surface of a magnet wire. For example, emitters may be spaced approximately 15 degrees apart along a circumference or periphery of an optic ring. The detection system 115 may be utilized to evaluate magnet wire having any suitable cross-sectional shape, such as a circular, rectangular, triangular, elliptical, hexagonal, or octagonal cross-sectional shape, or any cross-sectional shape having a convex geometry. In certain embodiments, the emitters may be spaced such that defects can be identified on any portion of the surface of a magnet wire with any suitable cross-sectional shape. For example, the emitters may be spaced such that defects can be identified on any portion of a surface of a rectangular magnet wire having rounded or curved corners.

Typically, rectangular magnet wire utilized in certain applications (e.g., automotive applications, etc.) may have short sides between approximately 1.0 mm and approximately 3.0 mm and long sides between approximately 2.0 mm and approximately 5.0 mm. In other embodiments, rectangular wire may have sides between 0.2 mm and 20 mm. Additionally, the corners of the magnet wire may occupy any suitable percentage of the side(s) of a wire. For example, a curved corner may be positioned in the last 1-50% of the length of a given side (i.e., the portion of a length that would result in a true rectangle absent a curved corner), such as within the last 1-25%, 1-10%, or 1-5% of the length of a given side. These sides include both the short (or thickness) and long (or flat) sides of a rectangular wire. Given the differences in the lengths of sides, a given corner may occupy a first percentage of a first side (e.g., 1-50% of a short side) while occupying a second percentage of a second side (e.g., a flat or long side). In certain embodiments, a wire may include four flat sides and four respective rounded or curved corners. In other embodiments, a wire may include a flat top and bottom with completely rounded or curved sides (or thicknesses). Additionally, a given corner may be formed with any suitable bend radius. In other words, a circle that defines the curve within a corner may have any suitable radius. For typical sizes and constructions of shaped rectangular wire, it has been found that emitters should be spaced no more than 17 degrees apart (e.g., 17 degrees apart around an optic ring, 17 degrees apart along a circle or outer periphery formed around an examination area) in order to adequately detect faults on any portion of the outer surface of the wire (i.e., flat surfaces and rounded corners) with the faults having amplitudes (e.g., protrusions from the outer surface of the wire) as small as 20 microns (e.g., defects or faults smaller than 22 microns, 25 microns, etc.). In other embodiments, adequate detection may be achieved with emitters that are spaced closer than 17 degrees apart or farther than 17 degrees apart. For example, in certain embodiments, the emitters in an optic ring may be spaced no more than 10, 12, 15, 17, 20, 25, or 30 degrees apart.

In certain embodiments, the emitter and detector pairs may all be positioned at approximately the same cross-sectional location along a longitudinal length of the detection component 115. In other embodiments, at least two emitter/detector pairs may be positioned at different cross-sectional locations along a longitudinal length of the detection component 115. For example, each pair may be positioned at a different longitudinally spaced location. In other embodiments, groups of pairs may be positioned at longitudinally spaced locations. For example, triads of emitter/detector pairs may be positioned at longitudinally spaced locations along a longitudinal length of the detection component 115. For a detection component 115 that includes 12 emitter/detector pairs, four triads of pairs may be positioned at four longitudinally spaced locations. As a result of longitudinally spacing emitter/detector pairs or groupings of pairs, the optic ring may be formed with a smaller diameter and/or the volume of the system 100 may be reduced. An example of detection component 115 and its optic ring is described in greater detail below with reference to FIGS. 2A-2D. Further, operation of an example emitter and detector pair is explained in greater detail below with reference to FIGS. 3 and 4.

With continued reference to FIGS. 1A-1H, the system 100 may optionally include one or more air ducts, such as air duct 155. An air duct 155 may facilitate the supply or input of pressurized air into the housing 105 via a suitable ventilation system or air supply (not shown). The pressurized air may assist in removing and/or keeping debris out of the housing 105. As a result, internal components of the system 100 (e.g., the optic ring of the detection component 115) may be maintained in better working order and kept clean. Additionally, the pressurized air may assist in cooling one or more internal components of the system 100, such as internal computing devices (e.g., circuit boards, electronic boards, microcontrollers, etc.), the emitters, etc. as desired, any number of suitable cooling or air flow channels may be incorporated into the housing and/or various internal components of the system 100 to facilitate cooling. In addition to or as an alternative to utilization of an air duct 155, any number of other suitable cooling devices may be incorporated into the system 100, such as one or more fluid flow channels, heat syncs, etc.

The housing 105 may also include any suitable number of openings, slots, or access areas, such as the illustrated slot 160, to facilitate the feeding of one or more cables or wires to the system 100 and/or internal components of the system 100. For example, one or more power and/or control cables may be fed through the slot 160 or other suitable openings. In certain embodiments, a suitable cable passthrough 165 or connection block may be implemented to cover the slot 160, prevent debris from entering the housing 105, and/or to provide a mechanical connection point for one or more cables. For example, cables may be connected to the passthrough 165 on an external side of the housing 105 and corresponding internal cables may connect from an internal side of the passthrough 165 to internal components of the system 100 (e.g., computing devices, etc.). In this regard, if the system 100 is moved or if an external force is imparted upon the system 100, it is unlikely that the internal cables will be disconnected. In yet other embodiments, cables and/or wires may be fed to and from the system 100 via sealed gaskets or other sealed components.

The system 100 may include any suitable number of computing devices that control the operations of the system 100. A wide variety of suitable computing devices may be utilized as desired, such as circuit boards, programmable logic arrays, microcontrollers, minicomputers, etc. Alternatively, the system 100 may be controlled via one or more external computing devices in communication with various components of the system 100. The computing device(s) may perform a wide variety of suitable operations as desired including, but not limited to, determining a wire size or establishing a baseline for a wire to be examined, providing control signals to the emitters and detectors, receiving data from the detectors, processing and evaluating the received data, identifying defects, counting defects, determining the size of defects, generating suitable alerts or output signals, and/or communicating with any suitable number of external devices or systems. In one example embodiment, the computing device(s) may be configured to receive a wide variety of signals or data, such as line speed inputs, one or more threshold values (e.g., a defect amplitude thresholds, defect count thresholds, etc.), one or more reset signals, etc. Based upon its calculations and processing, the computing device (s) may be configured to output any number of suitable signals, such as one or more identified defect counts (e.g., counts for different defect sizes), defect amplitudes, defect longitudinal lengths, identification information for emitter/detector pairs that identified defects, handshake signals, etc. The computing system(s) may also be configured to store a wide variety of suitable data, such as count data for one or more sizes of defects (e.g., small, medium, large, etc.), etc. In addition to one or more computing device(s), the system 100 may also include a wide variety of suitable noise filter circuitry to facilitate improved detection within the detection component 115.

The system 100 may provide a wide variety of benefits or advantages over prior magnet wire detection systems. First, the system 100 may have a relatively small size (e.g., a small volume, a small footprint, etc.) which allows the system to be mounted in a wide variety of locations within a wire line and/or in any suitable direction or orientation (e.g., horizontally, vertically, etc.). Due to the use of relatively inexpensive LED emitters and photodetectors, the system 100 may also have a lower cost than certain conventional detection systems, such as detection systems that utilize lasers and CMOS sensors. It also may be relatively easy from a time and cost perspective to repair the components of the system 100 and the optic ring. The system 100 may also be able to continue to operate and detect defects in wire if one or more of the emitters/detectors are inoperable. For example, even though there may be one or more blind spots in the examination area 190 and/or a minimum size of a detectable defect may increase, the system 100 may be utilized with less than 12 emitter/detector pairs.

In operation, the system 100 may be capable of evaluating or examining wire in a non-contact and non-destructive manner. The system 100 may also operate in an in-line manner, for example, while magnet wire is being produced. Further, the system 100 may be capable of providing real-time feedback as faults or defects are identified. Given the coverage of the emitter/detector pairs, the system 100 may be capable of detecting small defects (e.g., defects as small as 20 microns in amplitude, defects smaller than 25 microns, etc.) on any portion of the outer surface of a magnet wire having a wide variety of cross-sectional areas (e.g., rectangular wire with rounded corners, etc.).

The system 100 may include a wide variety of other components as desired. For example, the system 100 may include any number and type of emitters/detectors, a wide variety of cooling components, wire guides, mounting components, and/or computing devices (or controllers). As another example, the system 100 may be capable of wired and/or wireless communication with external systems or devices. It will be appreciated that various embodiments of the disclosure may include more or less components than those set forth and described above with reference to FIGS. 1A-1H. Indeed, the illustrated system 100 is provided by way of non-limiting example only.

Figure 2A:
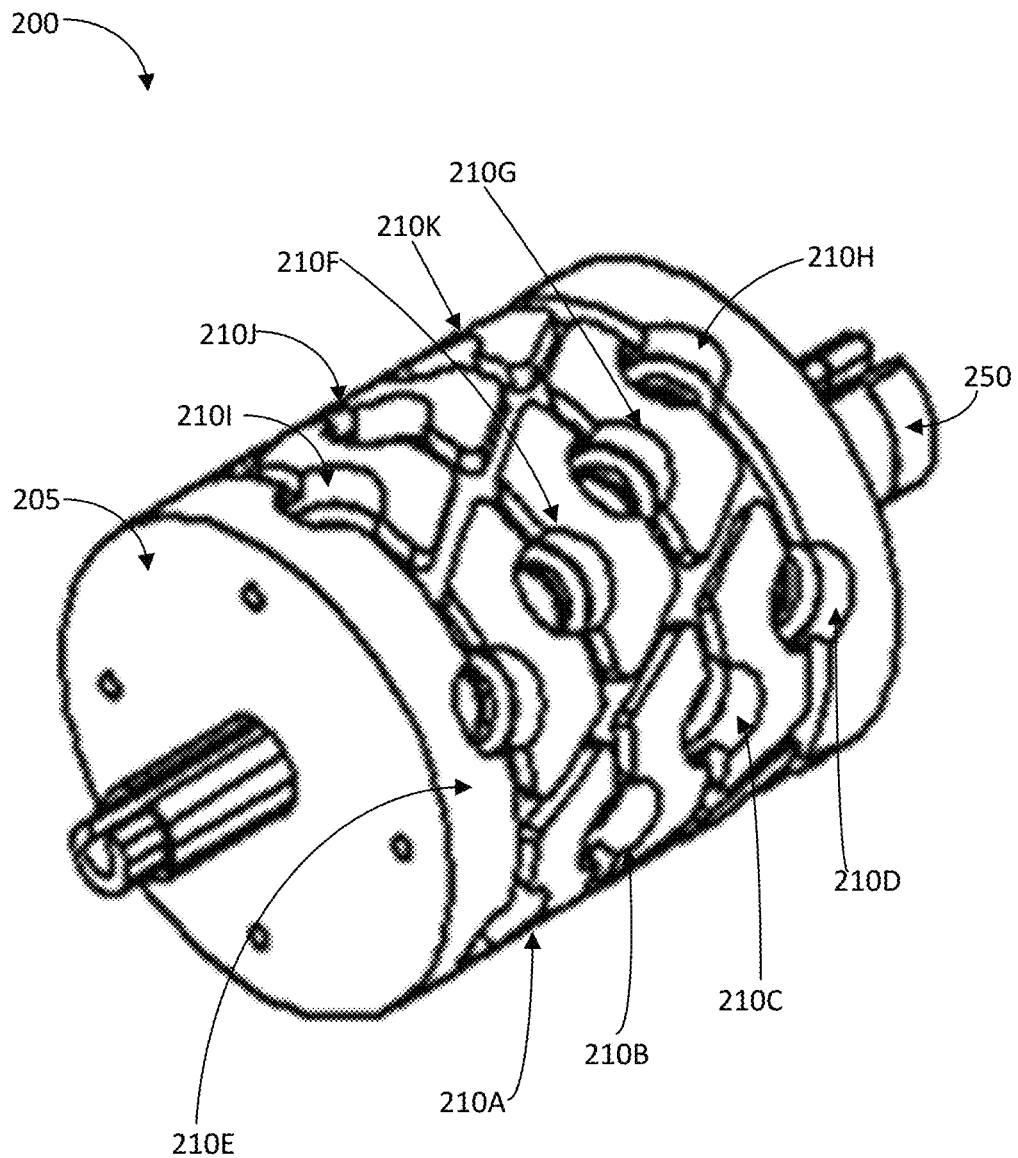
FIG. 2A illustrates a perspective view of an example detection component that may be incorporated into a fault detection system, according to an illustrative embodiment of the disclosure.
Figure 2B:
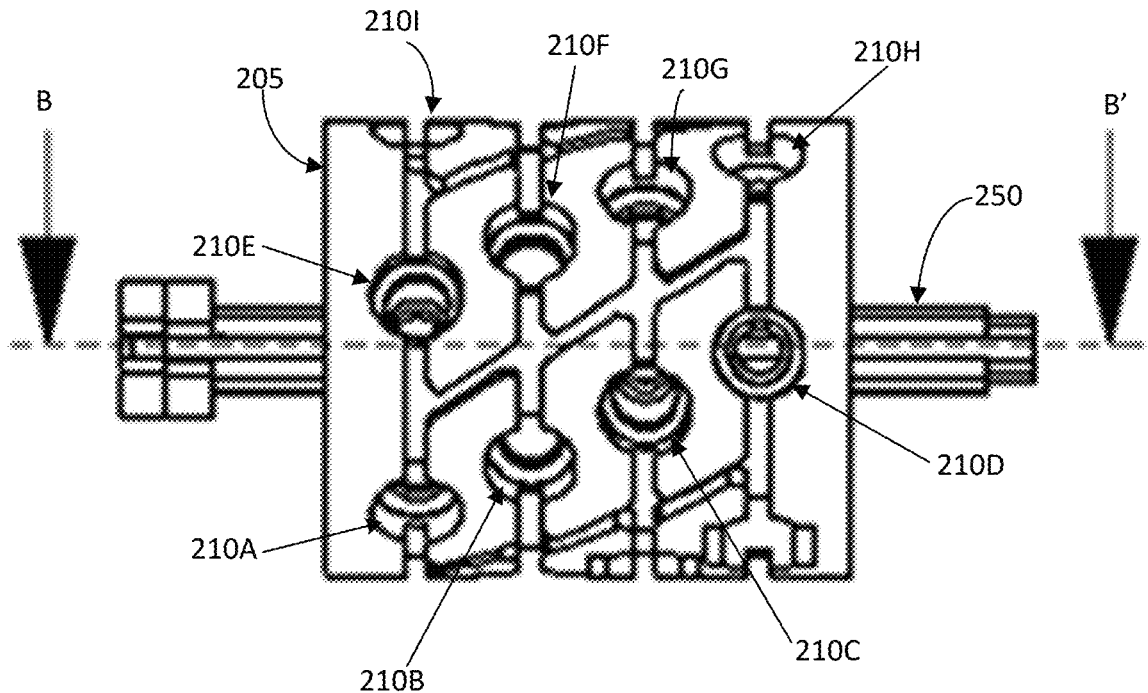
FIG. 2B illustrates a side view of the example detection component of FIG. 2A.
Figure 2C:
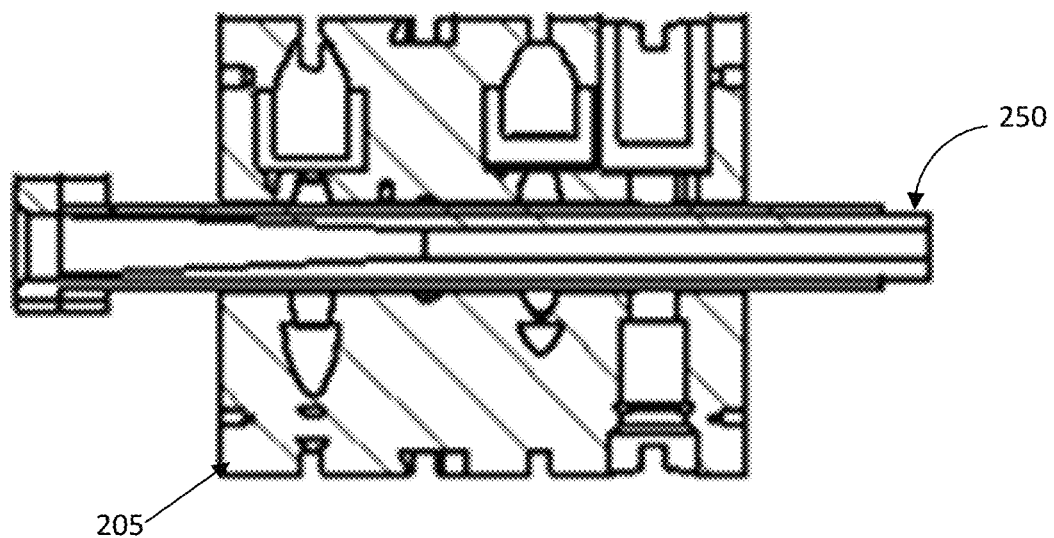
FIG. 2C illustrates a cross-sectional view of the example detection component of FIG. 2A.
Figure 2D:
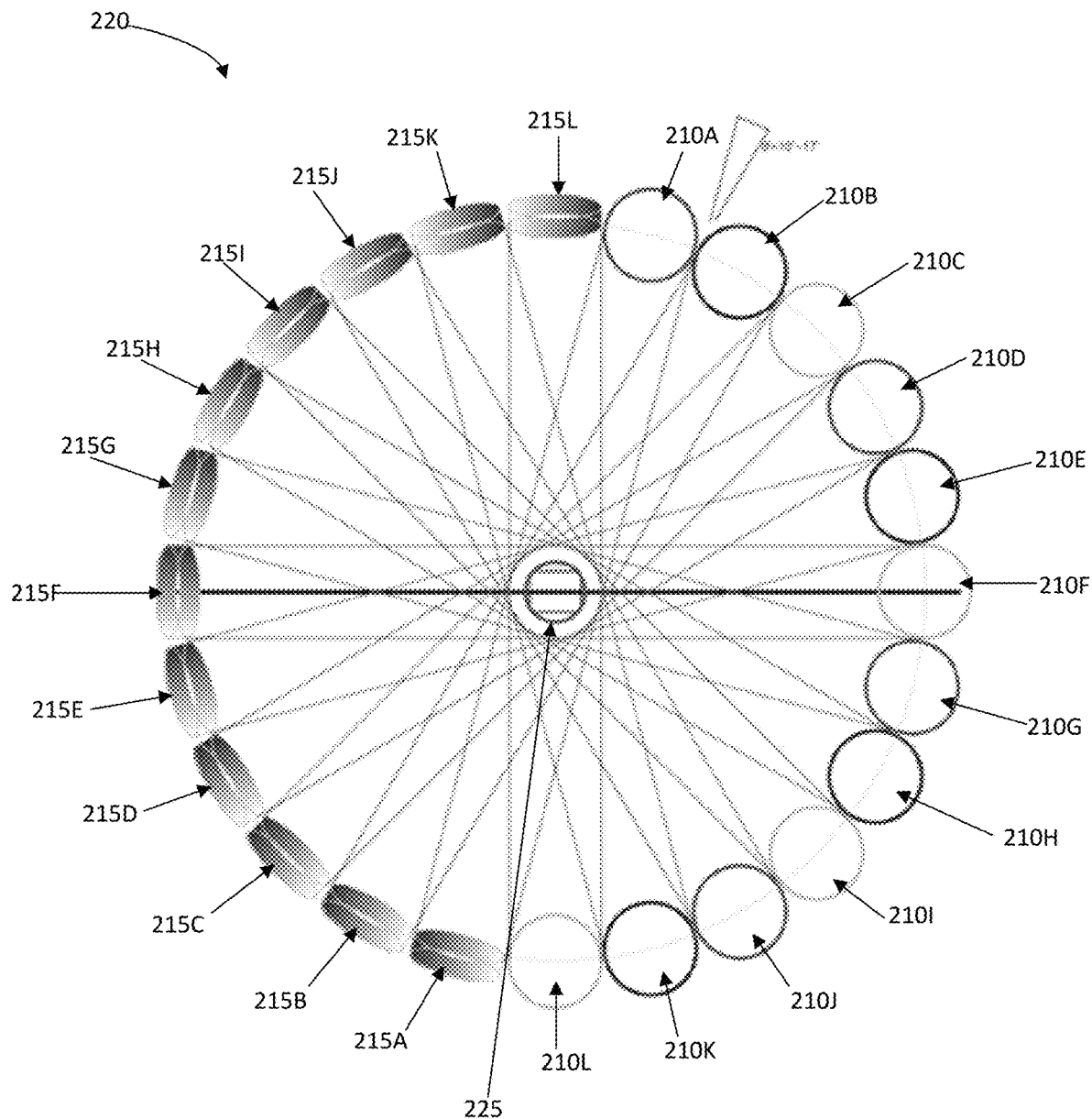
FIG. 2D illustrates a schematic cross-sectional view of an example optic ring that may be incorporated into the detection component of FIGS. 2A-2C.

FIGS. 2A-2D illustrate an example detection component 200 that may be incorporated into a fault detection system, such as the system 100 of FIGS. 1A-1H. For example, the detection component 200 of FIGS. 2A-2D may be utilized as the detection component 115 of FIGS. 1A-1H. In particular, FIG. 2A illustrates a perspective view of the example detection component 200; FIG. 2B illustrates a side view of the example detection component 200; FIG. 2C illustrates a cross-sectional view of the example detection component 200 taken along line B-B'; and FIG. 2D illustrates a schematic cross-sectional view of an example optic ring 220 that may be incorporated into the detection component 200.

The detection component 200 may include a suitable housing 205 into which a plurality of emitters 210A-L and detectors 215A-L may be positioned. The housing 205 may be formed from a wide variety of suitable materials as desired in various embodiments including, but not limited to, one or more plastics (e.g., ABS plastic, polycarbonate, etc.) or polymeric materials, etc. Additionally, the housing 205 may be formed utilizing a wide variety of suitable techniques, such as additive manufacture (e.g., 3D printing), molding, casting, etc. Any suitable number of emitters 210A-L and detectors 215A-L may be positioned within the housing 205 as desired, such as 6 or more pairs of emitters and detectors, or the 12 pairs of emitters 210A-L and detectors 215A-L illustrated in FIGS. 2A-2D. As shown in FIGS. 2A-2D and described in greater detail above with reference to FIGS. 1A-1H, the emitters 210A-L and detectors 215A-L may be positioned within an optic ring 220 that encircles an examination area 225 through which a magnet wire may traverse for examination.

As shown, the emitters 210A-L may be spaced approximately 180 degrees around an optic ring 220. The detectors 215A-L may then be spaced approximately 180 degrees around the other half of the optic ring 220 such that each detector (generally referred to as detector 215) is positioned across the optic ring 220 from a corresponding emitter (generally referred to as emitter 210). Additionally, as shown, groups of emitter and detector pairs may be positioned at longitudinally spaced locations along a length of the detection component 200. For example, triads of emitter/detector pairs may be positioned at longitudinally spaced locations along a longitudinal length of the detection component 200. For the example detection component 200 that includes 12 emitter/detector pairs, four triads of emitter/detector pairs may be positioned at four longitudinally spaced locations. For example, a first triad of emitters 210A, 210E, 210I and corresponding detectors 215A, 215E, 215I may be positioned at a first longitudinally spaced location; a second triad of emitters 210B; 210F, 210J and corresponding detectors 215B, 215F, 215J may be positioned at a second longitudinally spaced location; a third triad of emitters 210C, 210G, 210K and corresponding detectors 215C, 215G, 215K may be positioned at a third longitudinally spaced location; and a fourth triad of emitters 210D, 210H, 210L and corresponding detectors 215D, 215H, 215L may be positioned at a fourth longitudinally spaced location. Other positionings of emitter/detectors pairs may be utilized in other embodiments, and the illustrated positionings are provided by way of non-limiting example only.

Additionally, as shown in FIG. 2D, each adjacent set of emitters within an optic ring 220 (e.g., emitters 210A and 210B, emitters 210B and 210C, etc.) may be spaced from one another along the ring 220 such that the detection system 200 can identify faults on any portion of a surface of a magnet wire. For example, emitters may be spaced approximately 15 degrees apart along a circumference or periphery of the optic ring 220. In certain embodiments, the emitters in an optic ring 220 may be spaced no more than 10, 12, 15, or 17 degrees apart. In other embodiments, the adjacent emitters may be spaced no more than 30 degrees apart.

With continued referend to FIGS. 2A-2C, an example protective sleeve 250 is illustrated. The protective sleeve 250 may optionally be inserted into the detection component 200 to facilitate threading or positioning a magnet wire into and through the detection component 200. The protective sleeve 250 may prevent the magnet wire from damaging the detection component 200 and/or any of the emitters 210A-L and detectors 215A-L. Once the magnet wire is properly positioned, the protective sleeve 250 may be removed, thereby permitting the magnet wire to be analyzed for defects. An example protective sleeve, such as sleeve 250, is described in greater detail below with reference to FIG. 7. In other embodiments, other suitable protection devices and/or components may be utilized in association with a detection component 200.

The detection component 200 may include a wide variety of other constructions as desired. For example, the detection component 200 may include different numbers of emitter/detector pairs (e.g., at least 6 pairs, at least 8 pairs, etc.). Additionally, emitter/detector pairs may be positioned at a wide variety of suitable locations within the detection component 200. As desired, any suitable number of cooling channels (e.g., cooling channels that facilitate the circulation of pressurized air, etc.) and/or cooling devices (e.g., heat syncs, etc.) may be incorporated into the detection component 200. It will be appreciated that various embodiments of the disclosure may include more or less components than those set forth and described above with reference to FIGS. 2A-2D. Indeed, the illustrated detection component 200 is provided by way of non-limiting example only.

Figure 3:
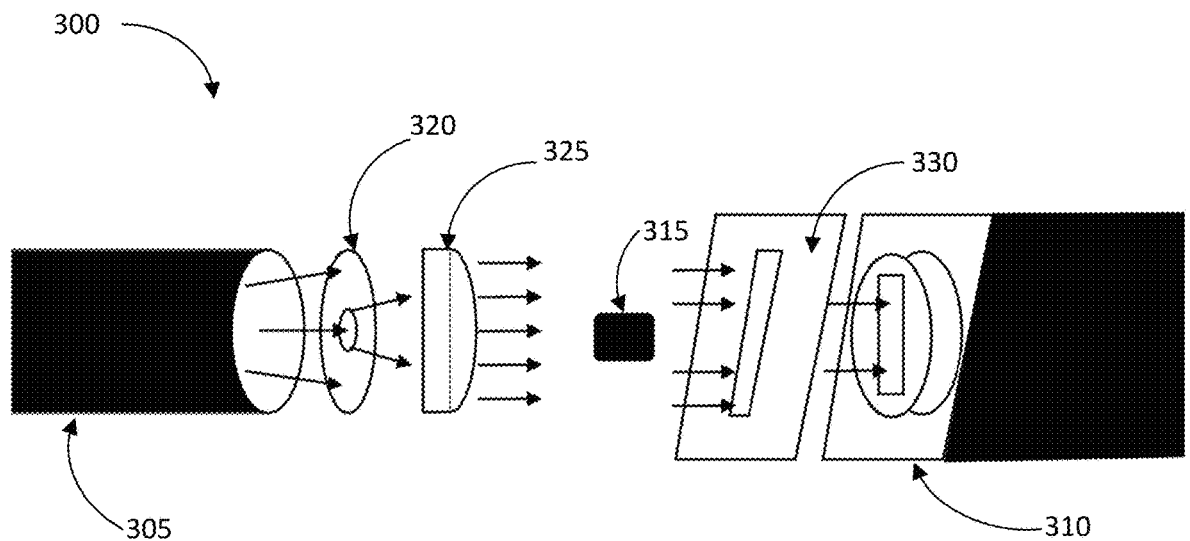
FIG. 3 illustrates a schematic view of an example emitter and detector pair that may be incorporated into a detection component, according to an illustrative embodiment of the disclosure.

FIG. 3 illustrates a schematic view of an example emitter and detector pair 300 that may be incorporated into a detection component, such as the detection component 115 of FIGS. 1A-1H or the detection component 200 of FIGS. 2A-2D. The pair 300 may include a suitable emitter 305, such as an LED emitter or laser LED configured to output light at a desired wavelength (e.g., 700 nm, etc.). Additionally, the pair 300 may include a suitable detector 310, such as a photodiode (e.g., a photodiode focused on a wavelength of 700 nm, etc.) configured to detect the light output by the corresponding emitter 305. The emitter 305 may output a light signal onto and past a magnet wire 315 that is being evaluated for defects, and the light signal may be detected by the detector 310. Based upon changes in the amount of light detected, a determination may be made as to whether a defect or fault is present on the magnet wire 315. For example, a decrease in light received by the detector 310 may indicate a larger profile of the wire 315 and/or its insulation, thereby indicating a defect protruding from the wire 315.

With continued reference to FIG. 3, a wide variety of suitable filtering and/or focusing devices may be incorporated into an emitter/detector pair 300 as desired in various embodiments. For example, the light output by the emitter 305 may be passed through a suitable pinhole plate 320 or other filtering device that limits the emitted light. Additionally, the light may be focused via any number of suitable lenses and/or focusing devices, such as a plano convex lens 325 that orients the emitted light in a parallel direction across the wire 315 and towards the detector 310. A suitable slit plate 330, such as a 200 micron slit plate, and/or any other suitable filtering devices may limit the light signal passed to the detector 310. In this regard, the detected light signal may be primarily focused on that output by the emitter 305 and noise from other emitters in a detection component may be reduced.

Figure 4:
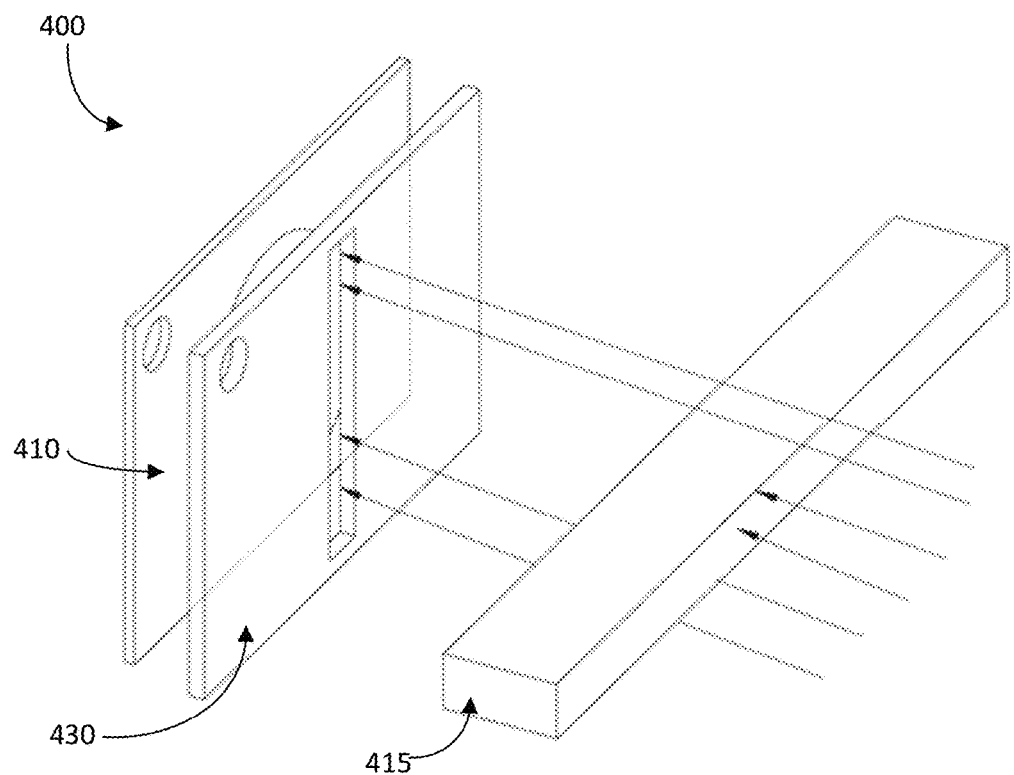
FIG. 4 illustrates a perspective schematic view of a detector that may be incorporated into a detection component, according to an illustrative embodiment of the disclosure.

FIG. 4 illustrates a perspective schematic view of an example detector 400 that may be incorporated into a detection component, such as the detection component 115 of FIGS. 1A-1H or the detection component 200 of FIGS. 2A-2D. In certain embodiments, the example detector 400 may be the detector 310 from FIG. 3. As shown in FIG. 4, light output by an emitter (e.g., emitter 305) may be detected by a corresponding detector 410, such as a corresponding photodiode. The output light may contact and pass by a magnet wire 415 that is being evaluated prior to being detected by the detector 410. As desired, one or more suitable slit plates 430 or other filtering devices may limit the light or filter the light that reaches the detector 410. In operation, the detector 410 may constantly measure an amount of light received in real time at any suitable sampling rate. Based upon changes in the amount of light received (e.g., a reduction in the received light), a defect on the magnet wire 415 or on the magnet wire insulation may be identified and a size of the defect (e.g., an amplitude, a longitudinal length) may be measured and/or determined. As shown in FIG. 4, the light signal may pass by the magnet wire 415 on opposing portions of an outer surface (e.g., the top and bottom surfaces, etc.). Accordingly, an emitter and detector pair may be utilized to identify defects on multiple portions of an outer surface of the magnet wire 415.

The emitters and detectors described above with reference to FIGS. 3 and 4 are provided by way of non-limiting example only. A wide variety of other suitable emitters and detectors may be utilized as desired in other embodiments of the disclosure. Additionally, any suitable filtering and/or focusing devices or components may be utilized.

Figure 5:
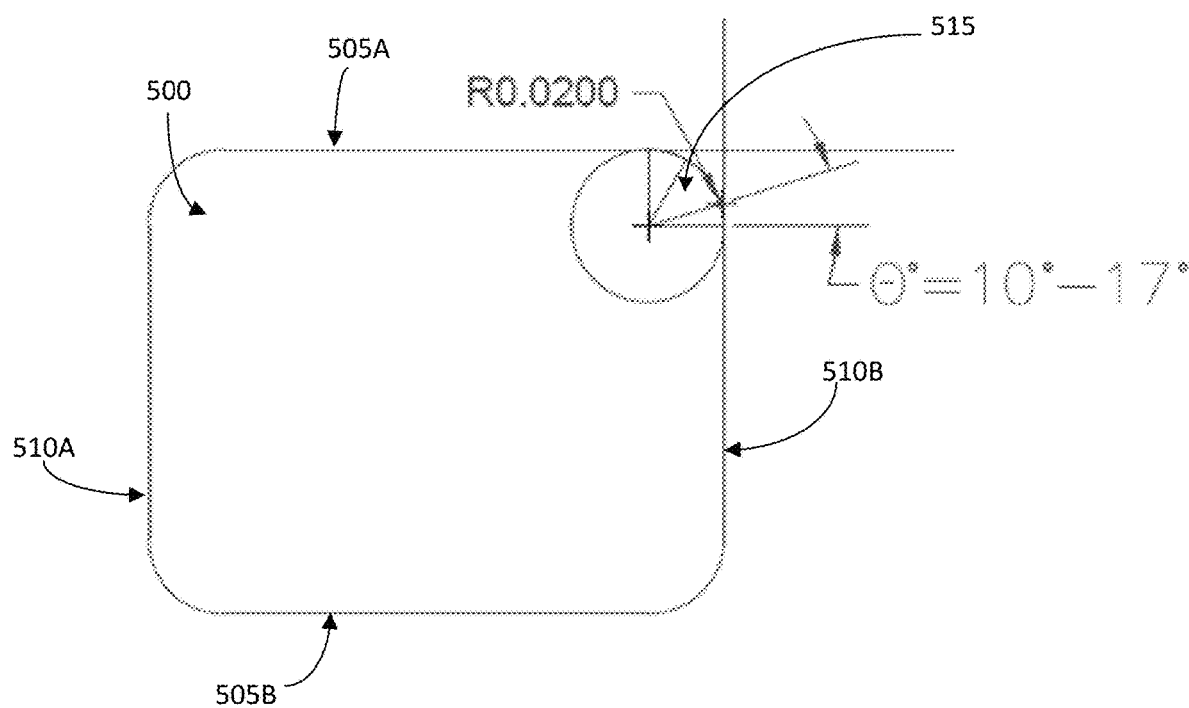
FIG. 5 illustrates a cross-sectional view of an example rectangular magnet wire that may be examined by a fault detection system, according to an illustrative embodiment of the disclosure.

FIG. 5 illustrates a cross-sectional view of an example rectangular magnet wire 500 that may be examined by a fault detection system, such as the system 100 of FIGS. 1A-1H. The rectangular wire 500 may have four sides, such as the illustrated long sides 505A-B (i.e., top and bottom sides) and short sides 510A-B (i.e., left and right sides). Additionally, the corners of the wire may be curved, rounded, or otherwise shaped such that two sides do not come together at a ninety-degree angle. A corner may occupy any suitable portion of the two sides that are meeting one another, such as between 1 and 10 percent of the respective lengths of the two sides. Additionally, a corner may be formed with a wide variety of suitable bend radii. Given typical rectangular wire dimensions utilized in certain magnet wire application (e.g., automotive applications), a detection system may be configured and/or optimized to detect defects on any portion of the surface of the wire 500 including any of the sides 505A-B, 510A-B and/or any of the curved, rounded, or non-square corners. In certain embodiments, a detection system may be configured to detect defects as small as 20 microns (e.g., defects smaller than 22 microns, defects smaller than 25 microns, etc.). It will be appreciated that a detection system is not limited to examining rectangular wire. Indeed, a detection system may also be utilized to examine wire having other suitable cross-sectional shapes (e.g., circular shapes, rectangular shapes with sharp corners, etc.).

Figure 6:
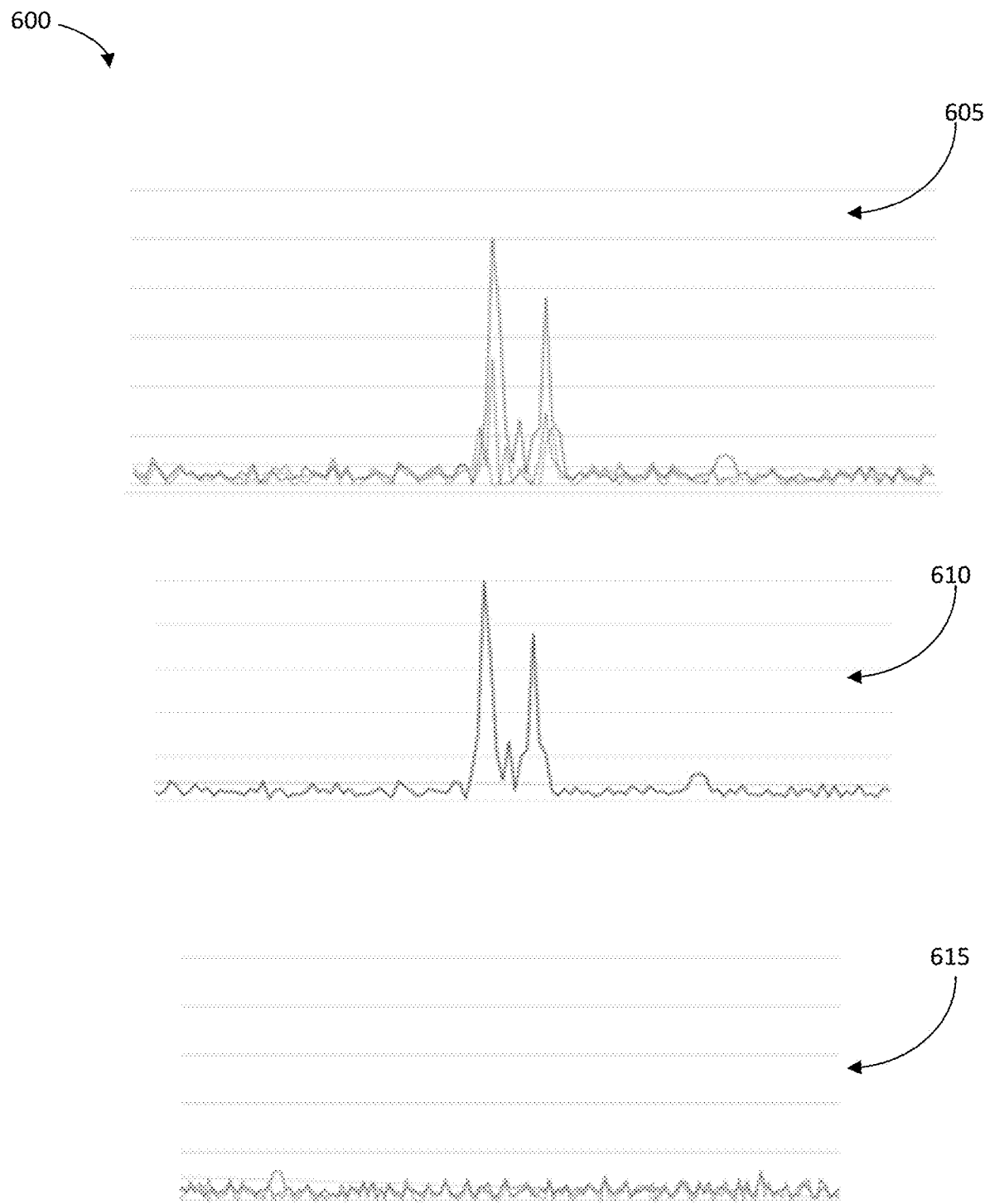
FIG. 6 illustrates example detection signals that may be generated by the detectors of a fault detection system, according to an illustrative embodiment of the disclosure.

FIG. 6 illustrates example detection signals 600 that may be generated by the detectors of a fault detection system, such as the system of FIGS. 1-H. The first example 605 depicts the detection of a defect or fault by a triad of detectors. As shown, one of the detectors in the triad records a higher amplitude for the defect than the other two detectors due to the angle of the emitted light across the defect from the corresponding emitter. When the amplitude of an identified defect is output and/or recorded, a highest detected amplitude may be utilized. Additionally, it should be noted that a longitudinal length of a defect may also be determined utilizing a line speed (i.e., a line speed provided to a detection system, etc.) and a wide variety of suitable techniques, such as identifying rising and falling edges of a defect or determining a total length in which an amount of measured light differs from a baseline. With continued reference to FIG. 6, the second example 610 depicts the detection of a defect by a single detector. Additionally, the third example 615 depicts the measurement signal of a detector when no defect is present or identified on a magnet wire. It will be appreciated that a baseline signal may be established when no defect is present, and a baseline amount of detected light may be based at least in part on the dimensions of a magnet wire being evaluated. Defects may then be identified based upon changes in the amplitude of measured light.

In certain embodiments, one or more suitable devices and/or components may be utilized to protect the detection device (i.e., the detection device 115 illustrated in FIGS. 1A-1H or the detection device 200 illustrated in FIGS.

Figure 7:
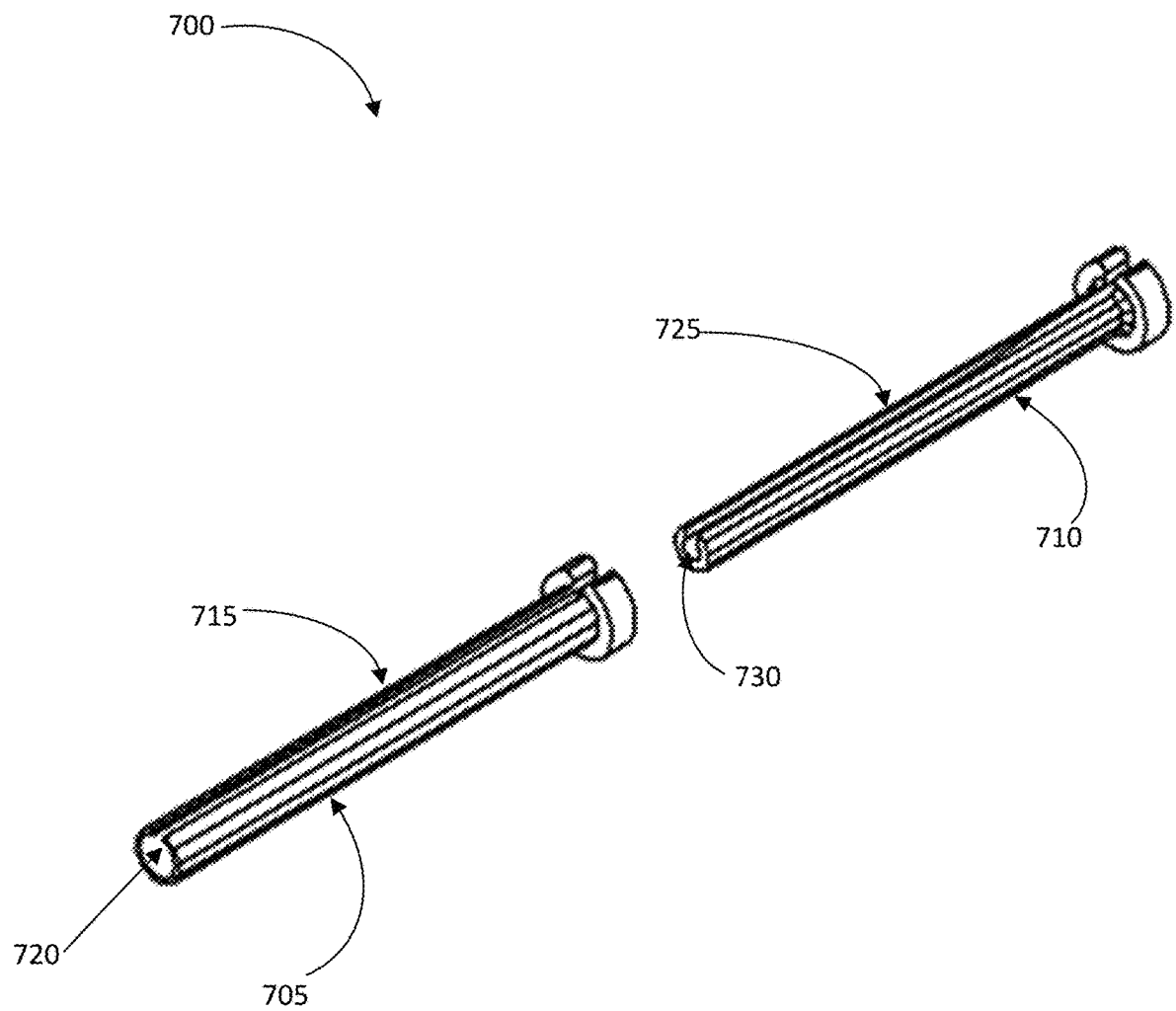
FIG. 7 illustrates a perspective view of an example protective sleeve that may be utilized to feed wire into a fault detection system, according to an illustrative embodiment of the disclosure.

2A-2D) of a fault detection system (i.e., the system 100 of FIGS. 1A-1H) and its associated emitters and detectors from damage during the insertion or feeding of a magnet wire into the system. FIG. 7 illustrates a perspective view of an example protective sleeve 700 that may be utilized to feed wire into a fault detection system, according to an illustrative embodiment of the disclosure. The protective sleeve 700 may be selectively inserted into a detection component to protect equipment and then removed to permit a magnet wire to be evaluated or analyzed.

With reference to FIG. 7, the example protective sleeve 700 may include two sleeve components 705, 710 having different diameters. In this regard, a second component 710 may be inserted or positioned within the first component 705. Additionally, the first component 705 may include a first longitudinally extending opening 715 or slit along its periphery that permits a magnet wire to be inserted into a first longitudinally extending cavity or channel 720. Similarly, the second component 710 may include a second longitudinally extending opening 725 along its periphery that permits a magnet wire to be inserted into a second longitudinally extending cavity or channel 730. In operation, the second component 710 may be positioned within the cavity 720 of the first component 705 such that the respective openings 715, 725 of the two components 705, 710 are not aligned with one another. A magnet wire may then be longitudinally fed through the protective sleeve 700 such that it is within the cavity 730 of the second component 710 (and, therefore, within the cavity 720 of the first component 705). The protective sleeve 700 (and the wire) may then be inserted into and/or through a detection component, and the wire may be prevented from contacting or damaging emitters or detectors by the protective sleeve. The wire may also be positioned within appropriate wire guides, such as the wire guides 140A-D illustrated in FIGS. 1A-1E. Once the wire has been fed through detection component, the protective sleeve 700 may be removed from the detection component. At least one of the first component 705 or the second component 710 may then be twisted or rotated such that the two openings 715, 725 are aligned with one another. As a result, the wire may be passed through the two openings 715, 725 and the protective sleeve 700 may be removed from a wire line. The wire may then be evaluated by the detection component. A similar process may be utilized in reverse to remove the wire. The protective sleeve 700 may be formed from a wide variety of suitable materials and/or combinations of materials including, but not limited to, one or more plastics (e.g., ABS plastic, polycarbonate, etc.) or polymeric materials, etc.

Figure 8A:
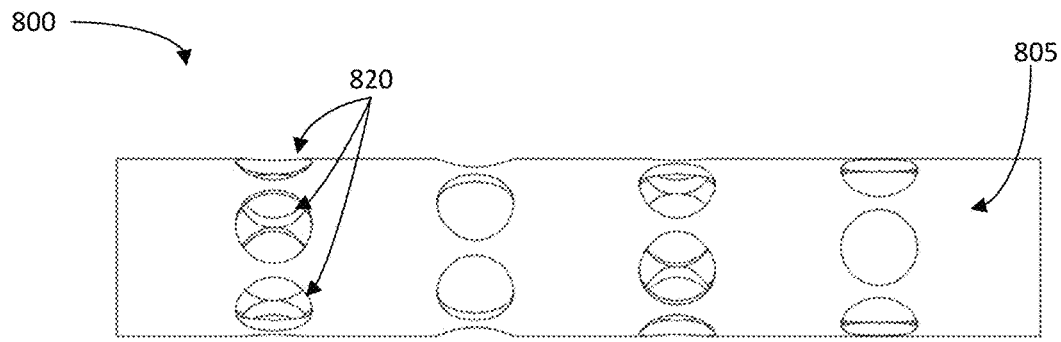
FIGS. 8A-8B illustrate another example protective sleeve that may be utilized in conjunction with a fault detection system, according to an illustrative embodiment of the disclosure.
Figure 8B:
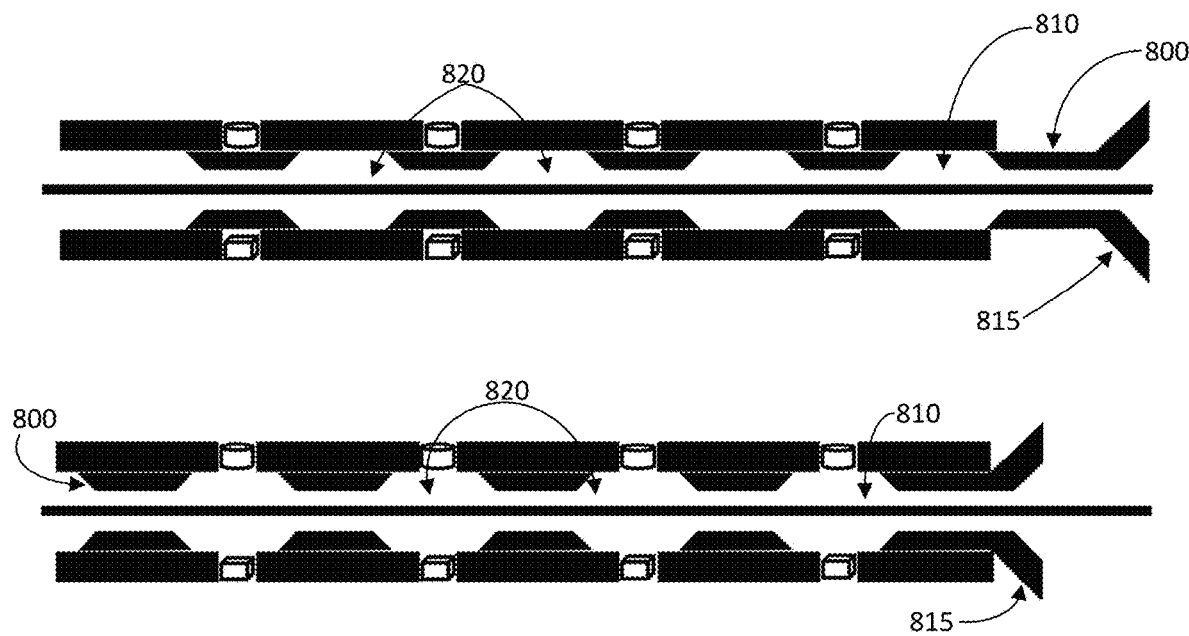

FIGS. 8A-8B illustrate another example protective sleeve 800 that may be utilized to protect the detection device (i.e., the detection device 115 illustrated in FIGS. 1A-1H or the detection device 200 illustrated in FIGS. 2A-2D) of a fault detection system (i.e., the system 100 of FIGS. 1A-1H) and its associated emitters and detectors from damage during the insertion or feeding of a magnet wire into the system. In particular, FIG. 8A illustrates a side view of the example protective sleeve, and FIG. 8B illustrates a schematic view of the protective sleeve 800 at different positions within a detection component. In contrast to the protective sleeve 700 of FIG. 7, the protective sleeve of FIGS. 8A-8B may remain within the detection component during examination of a magnet wire.

The protective sleeve 800 may include a body portion 805 formed from any number of suitable materials including, but not limited to, one or more plastics (e.g., ABS plastic, polycarbonate, etc.) or polymeric materials, etc. Additionally, a longitudinally extending cavity or channel 810 may extend through the body portion 805. In operation, a magnet wire may be fed through the channel 810. In certain embodiments, the protective sleeve 800 may include a suitable flange 815 positioned at one end (or both longitudinally opposite ends) of the sleeve 800. The flange 815 may assist in guiding a wire into the channel 810 and/or may control permitted amounts of movement of the protective sleeve 800 within the detection component. In certain embodiments, the protective sleeve 800 may be formed as a solitary or unitary structure.

According to an aspect of the disclosure, a plurality of openings 820 or slots may be formed through the body 805 into the channel 810. These openings 820 may be selectively aligned with the emitters and detectors of a detection component. For example, FIG. 8B illustrates example positionings 830, 835 of the protective sleeve 800 within a detection component. When the sleeve 800 is at a first position 830, the openings will not align with the emitters and detectors. As a result, the emitters and detectors may be protected by the body portion 805 from dust or debris and from damage caused by a magnet wire. A magnet wire may be fed through the channel 810 and the detection component without damaging the emitters and detectors. The protective sleeve 800 may then be adjusted or moved to a second position 835 in which the openings 820 are aligned with the emitters and detectors. As a result, the detection component may evaluate the magnet wire for defects.

The protective sleeve 800 may be moved in a wide variety of suitable direction in order to selectively align the openings with the emitters and detectors. As shown in FIG. 8B, in certain embodiments, the protective sleeve 800 may be moved along a longitudinal direction. In other embodiments, the protective sleeve 800 may be twisted or rotated within the detection component. Additionally, a wide variety of suitable methods or techniques may be utilized to adjust the position of the protective sleeve 800. In certain embodiments, one or more motors (e.g., servo motors, etc.) may be utilized to automatically adjust the position of the sleeve 800. In other embodiments, a position of the protective sleeve 800 may be adjusted manually. As desired, any number of suitable pins, tabs, or other devices may be utilized to maintain the protective sleeve 800 at a desired position when it does not need to be moved.

The protective sleeves 700, 800 illustrated in FIGS. 7-8B are non-limiting examples of components that may be utilized to protect a detection component from damage during the insertion and/or removal of a magnet wire. A wide variety of other suitable protection devices and/or components may be utilized in other embodiments. For example, a fault detection system (e.g., system 100 of FIGS. 1A-1H) may include any number of automated covers, shutters, or other devices that may be selectively closed or moved in front of emitters and detectors during the insertion and/or removal of wire.

Figure 9:
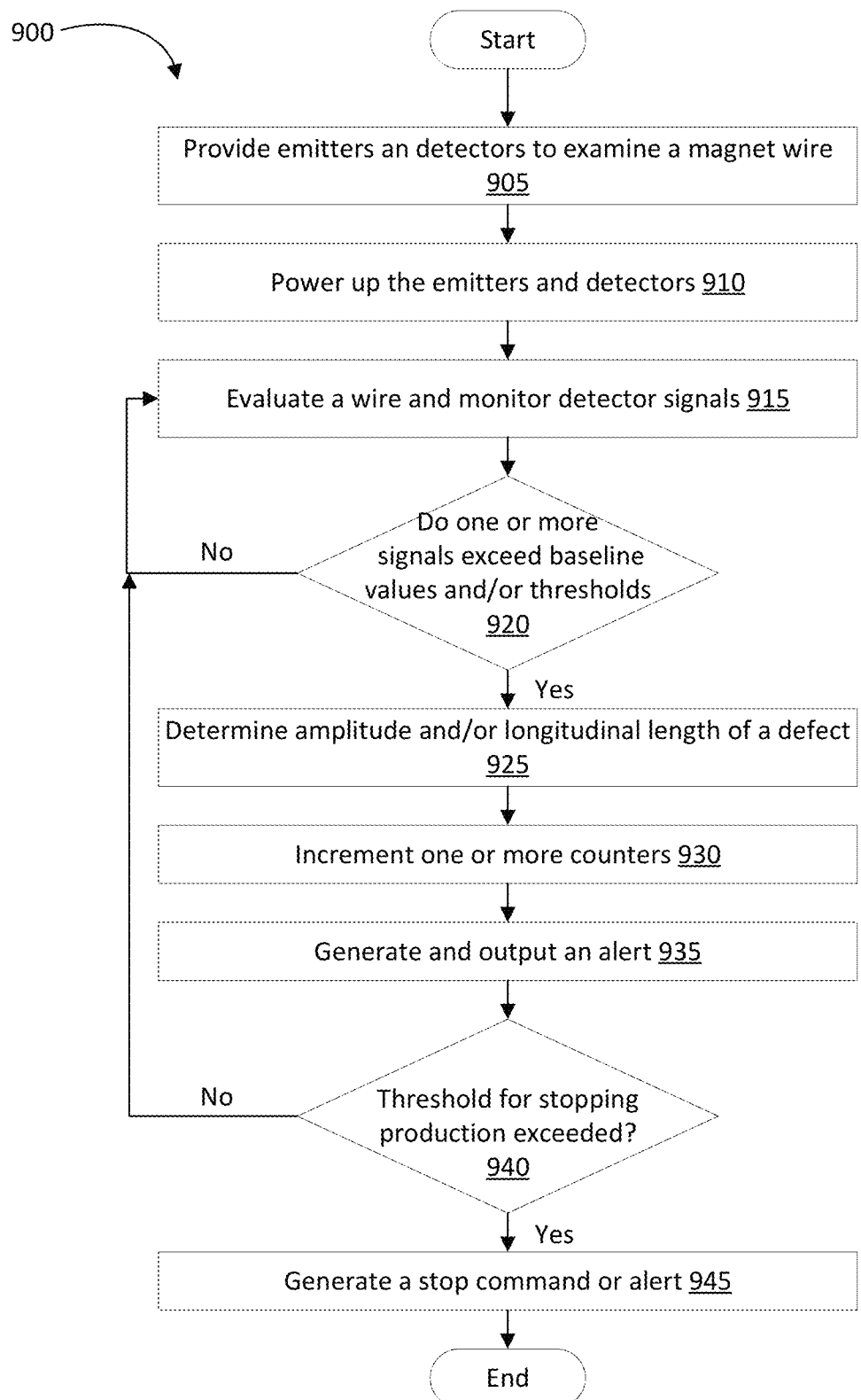
FIG. 9 is a flowchart depicting an example method for examining a magnet wire with a contactless fault detection system, according to an illustrative embodiment of the disclosure.

FIG. 9 is a flowchart depicting an example method 900 for examining a magnet wire with a contactless fault detection system, according to an illustrative embodiment of the disclosure. The method 900 may be performed by and/or utilized in association with a wide variety of fault detection systems, such as the example system 100 illustrated in FIGS. 1A-1H and described in greater detail above. The method 900 may begin at block 905. At block 905, a plurality of emitters and corresponding detectors configured to examine a magnet wire for defects may be provided. Any suitable number of emitters and detectors may be provided (e.g., more than 6 emitter/detector pairs, more than 8 pairs, etc.), such as 12 emitters and 12 corresponding detectors. As explained in greater detail above with reference to FIGS. 1A-1H and 2A-2D, the emitters and detectors may be positioned around an examination area into which a wire is positioned. For example, the emitters and detectors may be positioned along a periphery of a ring. Additionally, in certain embodiments, each adjacent set of emitters within the ring may be positioned no more than 17 degrees apart or no more than 30 degrees apart. For example, each adjacent set of emitters may be positioned approximately 15 degrees apart. The corresponding detector for each emitter may be positioned across the ring from the emitter. Additionally, the emitter/detector pairs may be positioned at any suitable locations along a longitudinal length of a detection component. For example, triads or groups of three emitter/detector pairs may be positioned at four longitudinally spaced locations.

At block 910, the plurality of emitters and detectors may be powered. Additionally, any suitable number of threshold values (e.g., a noise threshold, one or more defect thresholds, etc.) may be provided to the detectors. A magnet wire to be examined may then be passed through the examination area between the emitters and detectors. Each emitter may emit or cast a light onto and past the magnet wire, and the light may be measured by a corresponding detector. According to an aspect of the disclosure, the light may be cast and detected in a contactless manner and in a continuous manner as the magnet wire traversed through the examination area.

At block 915, the magnet wire may be evaluated for faults or defects as it is passed through the examination area and the signals captured by each detector are evaluated. In particular, the detectors may identify or detect changes in the amplitude of the light signal that is received. For example, a decrease in the amount of received light may indicate the presence of a defect protruding from the wire. The detectors may be sampled at any suitable rate. At block 920, a determination may be made as to whether a detected change in amplitude for one or more detectors exceed one or more baseline values and/or threshold values. For example, a determination may be made as to whether a detected light signal differs from a baseline amount by more than a minimum threshold and/or whether a detected change exceeds a noise threshold. If it is determined at block 920 that the signals from the detectors do not exceed any minimum or baseline thresholds for identification of a defect, then operations may continue at block 915 and monitoring of the wire may continue. If, however, it is determined at block 920 that the signals from one or more detectors include an amplitude change that exceeds one more minimum threshold values, then operations may continue at block 925.

At block 925, a defect or fault may be identified on the wire and one or more dimensions of the defect may be determined. For example, an amplitude of the defect may be determined. In the event that a plurality of detectors have identified the defect, then the amplitude may be determined as the largest amplitude identified by the plurality of detectors. Additionally, in certain embodiments, a longitudinal length of the defect may be determined. For example, a beginning point and an end point of the defect may be identified. Utilizing a line speed of the wire as it traverses through the examination area, the longitudinal length may be calculated.

At block 930, one or more suitable counters stored and/or output by the detection system may be incremented or adjusted. For example, a counter that keeps track of a total number of identified defects may be incremented. As another example, based upon a determined amplitude of a defect, an appropriate counter for a given defect size may be incremented. In certain embodiments, counters may be maintained for any suitable number of defect sizes or size ranges, such as small, medium, and large defects. At block 935, one or more suitable alerts may optionally be generated and output based upon the detection of a defect. For example, one or more defect counts, dimensions of an identified defect, and identification information for one or more detectors that identified the defect may be output as an alert message. As another example, a visual indicator (e.g., an LED light, a display, etc.) may be output on the fault detection system.

At block 940, a determination may be made as to whether continued manufacturing or production of the magnet wire should be halted. For example, a determination may be made as to whether an identified defect exceeds a maximum threshold value for an allowable defect on the wire. As another example, a determination may be made as to whether a total number of defects within a given length of wire exceeds a maximum threshold value. If it is determined at block 940 that production should not be stopped, then operations may continue at block 920 and the monitoring of the wire may continue. If, however, it is determined at block 940 that production should be stopped, then operations may continue at block 945 and a suitable stop common or alert may be output. The method 900 may end following either block 945 or when the emitters and detectors are powered down.

As desired, the method 900 may include more or less operations than those illustrated in FIG. 8. Additionally, as desired, certain operations of the method 900 may be formed in parallel or in a different order than that set forth in FIG. 9. Indeed, the method 900 is provided by way of non-limiting example only.

Conditional language, such as, among others, "can," "could," "might," or "may," unless specifically stated otherwise, or otherwise understood within the context as used, is generally intended to convey that certain embodiments could include, while other embodiments do not include, certain features, elements, and/or operations. Thus, such conditional language is not generally intended to imply that features, elements, and/or operations are in any way required for one or more embodiments or that one or more embodiments necessarily include logic for deciding, with or without user input or prompting, whether these features, elements, and/or operations are included or are to be performed in any particular embodiment.

Many modifications and other embodiments of the disclosure set forth herein will be apparent having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A fault detection system comprising:
an outer housing; and
a detection component positioned within the outer housing, the detection component comprising:
a plurality of emitters and a plurality of detectors positioned around an examination area through which a wire is traversed, wherein each adjacent pair of emitters included in the plurality of emitters is spaced no more than 30 degrees apart and each of the plurality of detectors is positioned across the examination area from a corresponding emitter included in the plurality of emitters, wherein each of the plurality of emitters is configured to emit a signal that is measured by a corresponding detector and the detection component is configured to detect one or more defects on a surface of the wire based upon changes in the signals measured by one or more of the plurality of detectors.

2. The system of claim 1, wherein each adjacent pair of emitters included in the plurality of emitters is spaced no more than 17 degrees apart.

3. The system of claim 1, wherein the wire comprises a rectangular wire having rounded corners and the detection component is configured to detect a defect extending by 20 microns from any portion of the surface of the wire.

4. The system of claim 1, wherein the detection component is further configured to determine an amplitude of a detected defect.

5. The system of claim 1, wherein the detection component is further configured to determine a longitudinal length of a detected defect based at least in part on a speed through which the wire is traversed through the examination area.

6. The system of claim 1, wherein:
the plurality of emitters comprises twelve emitters and the plurality of detectors comprises twelve detectors, and
each adjacent pair of emitters included in the plurality of emitters is spaced 15 degrees apart in a circle that surrounds the examination area.

7. The system of claim 1, wherein at least one of the plurality of emitters comprises a light emitting diode.

8. The system of claim 1, wherein at least one of the plurality of detectors comprises a photodetector.

9. The system of claim 1, wherein the plurality of emitters are grouped into a plurality of subsets, and each of the plurality of subsets is positioned at a respective spaced location along a longitudinal length of the detection component.

10. The system of claim 1, wherein a total volume of the system is less than one cubic foot.

11. The system of claim 1, wherein the wire does not contact the detection component.

12. A fault detection system comprising:
an outer housing; and
a detection component positioned within the outer housing, the detection component comprising:
at least six emitter and detector pairs positioned around an examination area through which a wire is traversed, wherein each detector is positioned across the examination area from a corresponding emitter,
wherein each emitter is configured to emit a signal that is measured by a corresponding detector and the detection component is configured to detect one or more defects on a surface of the wire based upon changes in the signals measured by one or more of the detectors.

13. The system of claim 12, wherein each adjacent set of emitters is spaced no more than 30 degrees apart from one another along a ring formed around the examination area.

14. The system of claim 12, wherein each adjacent set of emitters is spaced no more than 17 degrees apart from one another along a ring formed around the examination area.

15. The system of claim 12, wherein wire comprises a rectangular wire having rounded corners and the detection component is configured to detect a defect extending by 20 microns from any portion of the surface of the wire.

16. The system of claim 12, wherein the detection component is further configured to determine at least one of (i) an amplitude of a detected defect or (ii) a longitudinal length of a detected defect.

17. The system of claim 12, wherein:
the system comprises at least twelve emitter and detector pairs positioned around the examination area, and
each adjacent set of emitters is spaced 15 degrees apart from one another along a ring formed around the examination area.

18. The system of claim 12, wherein at least one emitter comprises a light emitting diode.

19. The system of claim 12, wherein at least one detector comprises a photodetector.

20. The system of claim 12, wherein a first subset of the at least six emitters and a second subset of the at least six emitters are positioned at respective spaced locations along a longitudinal length of the detection component.

21. The system of claim 12, wherein a total volume of the system is less than one cubic foot.

22. The system of claim 12, wherein the wire does not contact the detection component.

23. A fault detection system comprising:
an outer housing; and
a detection component positioned within the outer housing, the detection component comprising:
a plurality of emitters and detectors positioned around an examination area through which a rectangular wire with rounded corners is traversed, wherein each detector is positioned across the examination area from a corresponding emitter,
wherein each emitter is configured to emit a respective signal across a respective portion of an outer surface of the wire, each detector is configured to detect the respective signal of a corresponding emitter, and the detection component is configured to detect one or more defects on the outer surface of the wire based upon changes in the signals measured by one or more of the detectors,
wherein the detection component is configured to detect one or more defects having respective amplitudes of 20 microns on any portion of the outer surface.

* * * * *